(12) United States Patent
Chen et al.

(10) Patent No.: US 12,476,217 B2
(45) Date of Patent: Nov. 18, 2025

(54) SEMICONDUCTOR STRUCTURE

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/677,913

(22) Filed: May 30, 2024

(65) Prior Publication Data

US 2024/0321814 A1    Sep. 26, 2024

Related U.S. Application Data

(63) Continuation of application No. 17/462,021, filed on Aug. 31, 2021, now Pat. No. 12,021,057.

(51) Int. Cl.
*H01L 23/00* (2006.01)

(52) U.S. Cl.
CPC ............. *H01L 24/73* (2013.01); *H01L 24/04* (2013.01); *H01L 24/05* (2013.01); *H01L 24/24* (2013.01); *H01L 24/11* (2013.01); *H01L 24/16* (2013.01); *H01L 24/32* (2013.01); *H01L 24/94* (2013.01); *H01L 24/97* (2013.01);
(Continued)

(58) Field of Classification Search
CPC ............... H01L 21/76898; H01L 21/78; H01L 2224/0401; H01L 2224/05558; H01L 2224/1146; H01L 2224/11912; H01L 2224/16145; H01L 2224/24105; H01L 2224/24146; H01L 2224/32145; H01L 2224/73103; H01L 2224/73259; H01L 2224/73267; H01L 2225/06527; H01L 2225/06541; H01L 2225/06548; H01L 2225/06568; H01L 2225/06582; H01L 23/481; H01L 23/5389; H01L 23/585; H01L 24/04; H01L 24/05; H01L 24/08; H01L 24/11; H01L 24/16; H01L 24/24; H01L 24/32; H01L 24/73; H01L 24/80; H01L 24/94; H01L 24/97; H01L 25/0657; H01L 25/50

See application file for complete search history.

(56) References Cited

U.S. PATENT DOCUMENTS 10,504,852 B1 * 12/2019 Chen .................... H01L 25/0657
10,672,820 B2 *  6/2020 Tsai ........................ H01L 24/94
(Continued)

*Primary Examiner* — Telly D Green
(74) *Attorney, Agent, or Firm* — JCIPRNET

(57) ABSTRACT

A semiconductor structure including a first semiconductor die and a second semiconductor die is provided. The first semiconductor die includes a first bonding structure. The second semiconductor die is bonded to the first bonding structure of the first semiconductor die. The first bonding structure includes a first dielectric layer, a second dielectric layer covering the first dielectric layer, and first conductors embedded in the first dielectric layer and the second dielectric layer, wherein each of the first conductors includes a first conductive barrier layer covering the first dielectric layer and a first conductive pillar disposed on the first conductive barrier layer, and the first conductive pillars are in contact with the second dielectric layer.

20 Claims, 41 Drawing Sheets

(52) U.S. Cl.
CPC ............. *H01L 2224/0401* (2013.01); *H01L 2224/05558* (2013.01); *H01L 2224/1146* (2013.01); *H01L 2224/11912* (2013.01); *H01L 2224/16145* (2013.01); *H01L 2224/24105* (2013.01); *H01L 2224/24146* (2013.01); *H01L 2224/32145* (2013.01); *H01L 2224/73103* (2013.01); *H01L 2224/73259* (2013.01); *H01L 2224/73267* (2013.01)

(56) References Cited

U.S. PATENT DOCUMENTS

| | | | |
|---|---|---|---|
| 11,114,433 B2* | 9/2021 | Chen | H01L 23/5226 |
| 11,380,645 B2* | 7/2022 | Yu | H01L 23/5329 |
| 11,658,069 B2* | 5/2023 | Chen | H01L 24/19 |
| | | | 438/118 |
| 12,021,057 B2* | 6/2024 | Chen | H01L 24/08 |
| 2015/0021785 A1* | 1/2015 | Lin | H01L 21/76897 |
| | | | 438/459 |
| 2016/0013099 A1* | 1/2016 | Tanida | H01L 25/18 |
| | | | 438/107 |
| 2018/0012868 A1* | 1/2018 | Huang | H01L 24/94 |
| 2020/0020684 A1* | 1/2020 | Chen | H01L 21/76877 |
| 2020/0235063 A1* | 7/2020 | Chen | H01L 25/50 |
| 2020/0266146 A1* | 8/2020 | Nishida | H01L 24/73 |
| 2020/0350322 A1* | 11/2020 | Liu | H10B 43/40 |
| 2021/0066224 A1* | 3/2021 | Jang | H01L 24/08 |
| 2021/0118827 A1* | 4/2021 | Chen | H01L 21/76879 |
| 2021/0159201 A1* | 5/2021 | Yu | H01L 24/19 |
| 2021/0305094 A1* | 9/2021 | Chen | H01L 21/76831 |
| 2021/0343654 A1* | 11/2021 | Huang | H01L 21/76877 |

* cited by examiner

SEMICONDUCTOR STRUCTURE

CROSS-REFERENCE TO RELATED APPLICATION

This application is a continuation application of and claims the priority benefit of a prior application Ser. No. 17/462,021, filed on Aug. 31, 2021. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
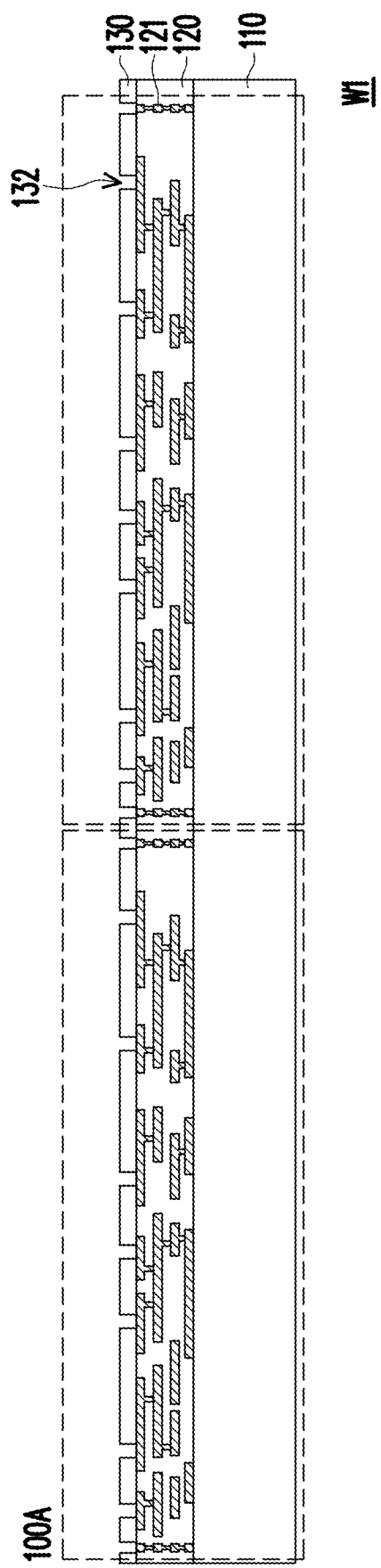
FIG. 1 through FIG. 8 are cross-sectional views schematically illustrating a process flow for fabricating a semiconductor die in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 8 are cross-sectional views schematically illustrating a process flow for fabricating a semiconductor die in accordance with some embodiments of the present disclosure.

Referring to FIG. 1, a semiconductor wafer W1 including semiconductor dies 100A arranged in array is provided. The semiconductor wafer W1 may include a semiconductor substrate 110, an interconnect structure 120 disposed on the semiconductor substrate 110 and a first dielectric layer 130 covering the interconnect structure 120. The semiconductor substrate 110 may be a silicon substrate including active components (e.g., transistors or the like) and passive components (e.g., resistors, capacitors, inductors, or the like) formed therein. The active components and passive components are formed in the semiconductor substrate 110 through front end of line (FEOL) fabrication processes of the semiconductor wafer W1. The interconnect structure 120 may include interconnect wirings (e.g., copper interconnect wirings) and dielectric layers stacked alternately and first seal ring elements 121 embedded in the interconnect structure 120. The interconnect wirings of the interconnect structure 120 are electrically connected to the active components and/or the passive components in the semiconductor substrate 110. The interconnect structure 120 is formed through back end of line (BEOL) fabrication processes of the semiconductor wafer W1. The first dielectric layer 130 is formed by performing a patterning process to a first dielectric material layer. The first dielectric material layer may include a dielectric material such as silicon oxide, silicon nitride, polymer or a combination thereof, and is formed by any deposition process such as a chemical vapor deposition (CVD) process, a physical vapor deposition (PVD) process or other applicable deposition processes followed by a planarization process such as a chemical mechanical polishing (CMP) process, a mechanical grinding process, combinations thereof or other applicable planarization processes. The first dielectric layer 130 include openings 132 formed by the patterning process. The uppermost layer of the interconnect structure 120 is partially revealed by the openings 132 defined in the first dielectric layer 130. The patterning process may include lithography and etching processes.

Figure 2:
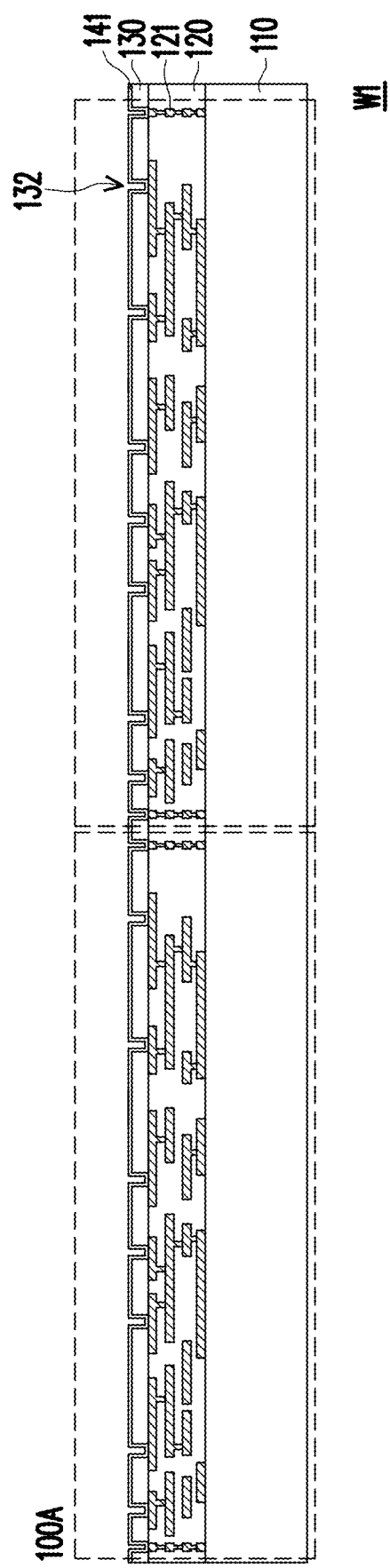
Figure 3:
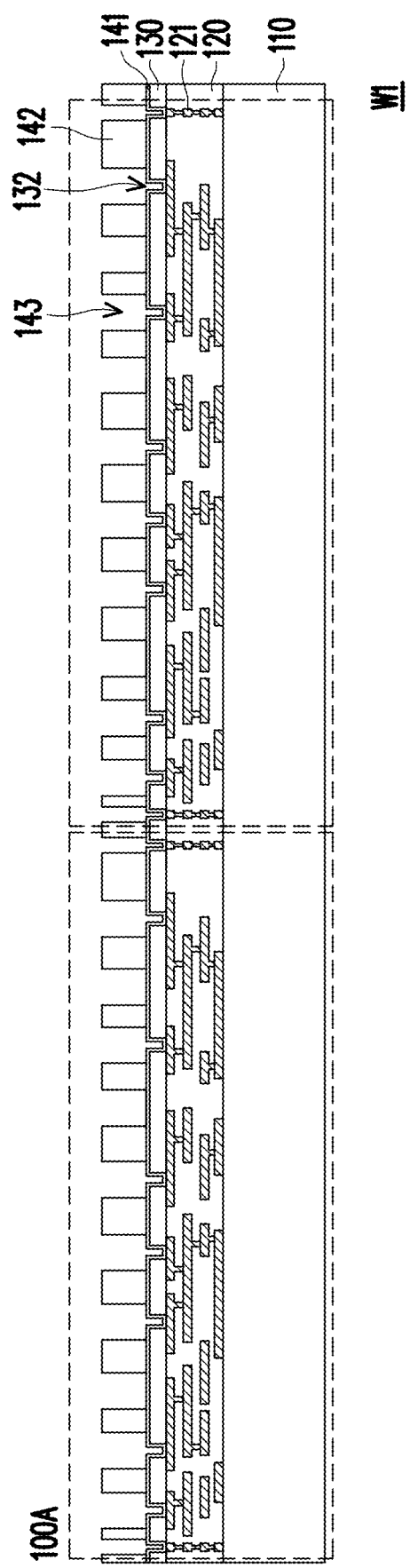

Referring to FIG. 2 and FIG. 3, a seed layer 141 is formed on the first dielectric layer 130 and revealed portions of the uppermost layer of the interconnect structure 120 through a sputtering process. The seed layer 141 may be a metal seed layer such as a Cu seed layer, a Ti seed layer, a Ti/Cu seed layer or the like. A patterned photoresist layer 142 is then formed on the seed layer 141 by a suitable process. The seed layer 141 is partially revealed by openings 143 defined in the patterned photoresist layer 142. The patterned photoresist layer 142 may be formed through a spin coating process followed by a photolithography process such that a predetermined pattern can be transferred onto the patterned photoresist layer 142.

Figure 4:
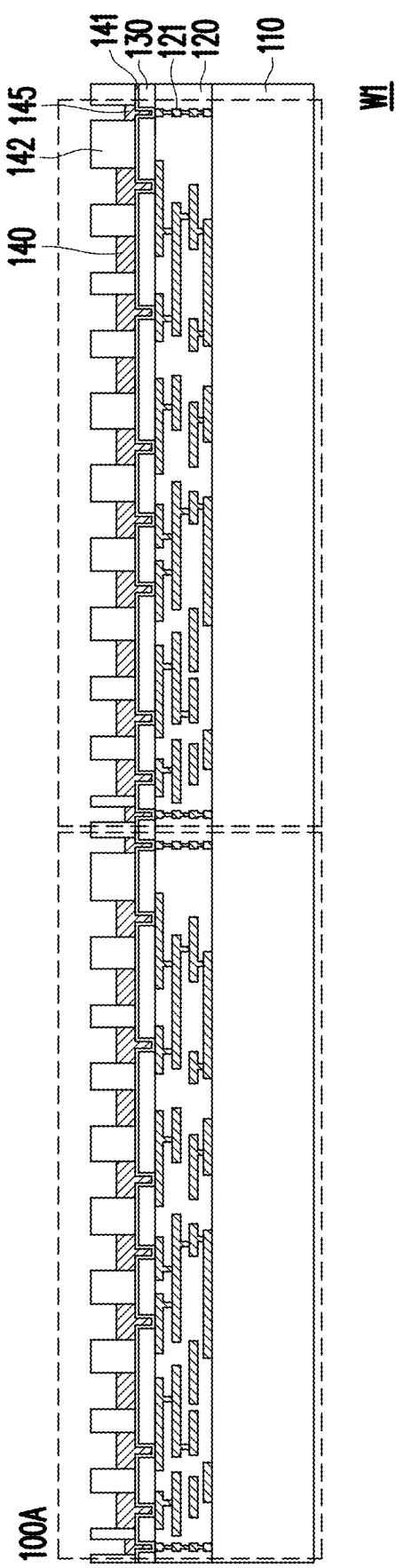

Referring to FIG. 4, at least one plating process is then performed such that a conductive material layer 140 is plated on portions of the seed layer 141 revealed by the openings 143 defined in the patterned photoresist layer 142. The material of the conductive material layer 140 may include copper or other suitable metallic materials. In some embodiments, as illustrated in FIG. 4, the plated conductive material layer 140 partially fills the openings 143 such that top surfaces of the conductive material layer 140 are lower than the top surface of the patterned photoresist layer 142. In some alternative embodiments, not illustrated in figures, the conductive material layer 140 fills the openings 143 such that top surfaces of the conductive material layer 140 are substantially leveled with or slightly higher than the top surface of the patterned photoresist layer 142.

Figure 5:
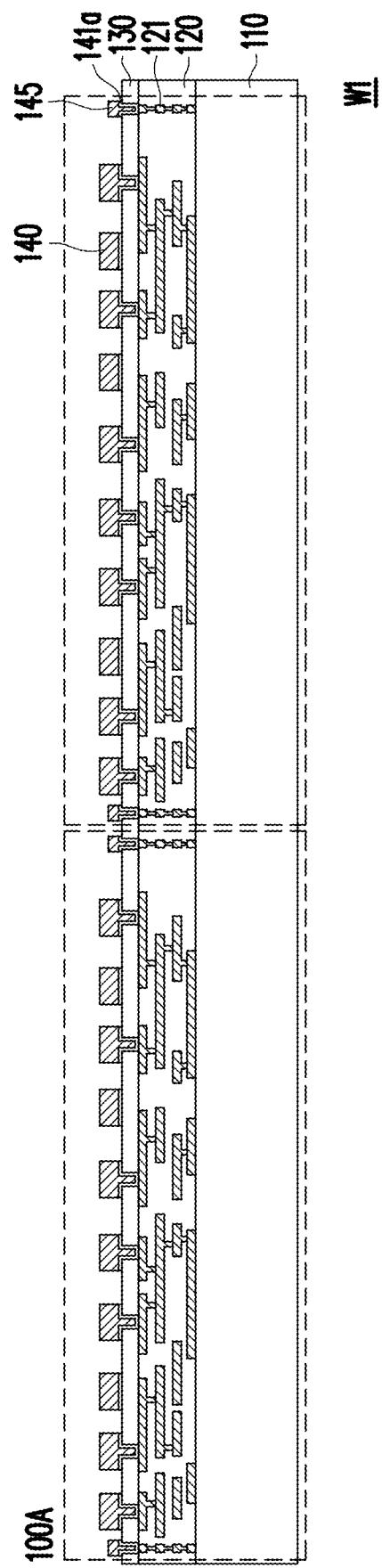

Referring to FIG. 5, a removal process for removing the patterned photoresist layer 142 is performed to reveal the seed layer 141 uncovered by the conductive material layer 140. The removal process may be a stripping process, an ash process, an etch process, combinations thereof, or other applicable removal processes. After removing the patterned photoresist layer 142, a patterning process for partially removing the seed layer 141 may be performed such that a conductive barrier layer 141a with predetermined pattern is formed over the first dielectric layer 130. In some embodiments, the seed layer 141 is patterned by an etching process by using the conductive material layer 140 as an etch mask until portions of the first dielectric layer 130 are revealed. As illustrated in FIG. 5, the conductive barrier layer 141a is formed under the conductive material layer 140.

Figure 6:
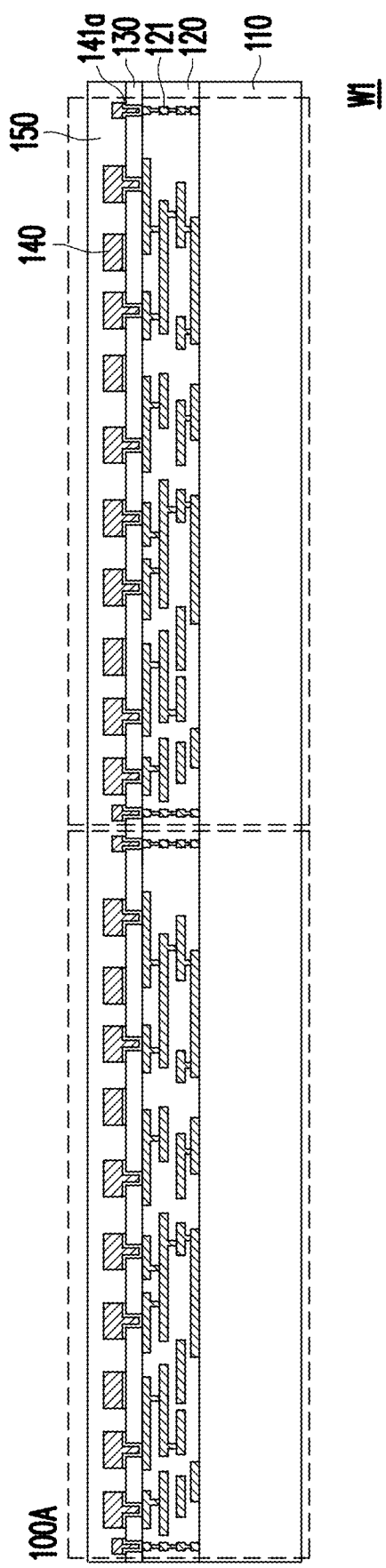
Figure 7:
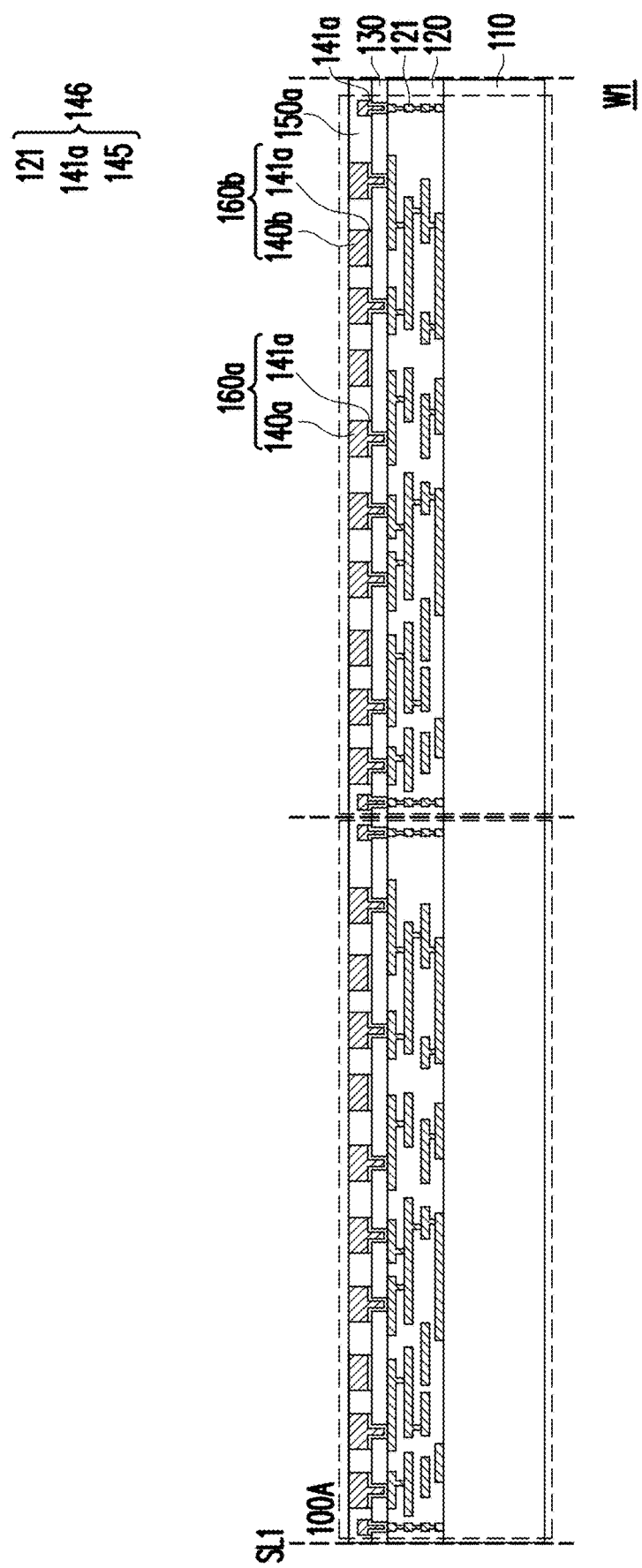

Referring to FIG. 6 and FIG. 7, a second dielectric material layer 150 is formed over the semiconductor substrate 110 to cover the first dielectric layer 130 and the conductive material layer 140. The second dielectric material layer 150 may be formed over the semiconductor substrate 110 by a chemical vapor deposition (CVD) process, a physical vapor deposition (PVD) process or other applicable deposition processes. The second dielectric material layer 150 may include a dielectric material such as silicon oxide, silicon nitride, polymer or a combination thereof. The dielectric material of the second dielectric material layer 150 may be the same as or different from the first dielectric layer 130. A planarization process is then performed to remove a portion of the second dielectric material layer 150 and a portion of the conductive material layer 140, so that a second dielectric layer 150a, conductive pillars 140a, conductive pillars 140b and second seal ring elements 145 are formed. In some embodiments, top surfaces of the second seal ring elements 145 are lower than the top surfaces of the conductive pillars 140a and 140b. In some alternative embodiments, top surfaces of the second seal ring elements 145 are substantially leveled with the top surfaces of the conductive pillars 140a and 140b. The planarization process may be a chemical mechanical polishing (CMP) process, a mechanical grinding process, combinations thereof or other applicable planarization processes. After performing the planarization process, the conductive pillars 140a and the conductive pillars 140b are embedded in and laterally encapsulated by the second dielectric layer 150a. In some embodiments, as illustrated in FIG. 7, the top surfaces of conductive pillars 140a and the conductive pillars 140b are substantially leveled with the top surface of the second dielectric layer 150a. In some alternative embodiments, not illustrated in figures, the top surfaces of conductive pillars 140a and the conductive pillars 140b are slightly lower or slightly higher than the top surface of the second dielectric layer 150a. Each of the conductive pillars 140a and the conductive barrier layer 141a disposed under the conductive pillars 140a constitute a first conductor 160a, while each of the conductive pillars 140b and the conductive barrier layer 141a disposed under the conductive pillars 140b constitute a first conductor 160b. In addition, each of the second seal ring elements 145, the conductive barrier layer 141a disposed under the second seal ring elements and the first seal ring element 121 disposed under the second seal ring elements 145 constitute a seal ring structure 146.

Figure 8:
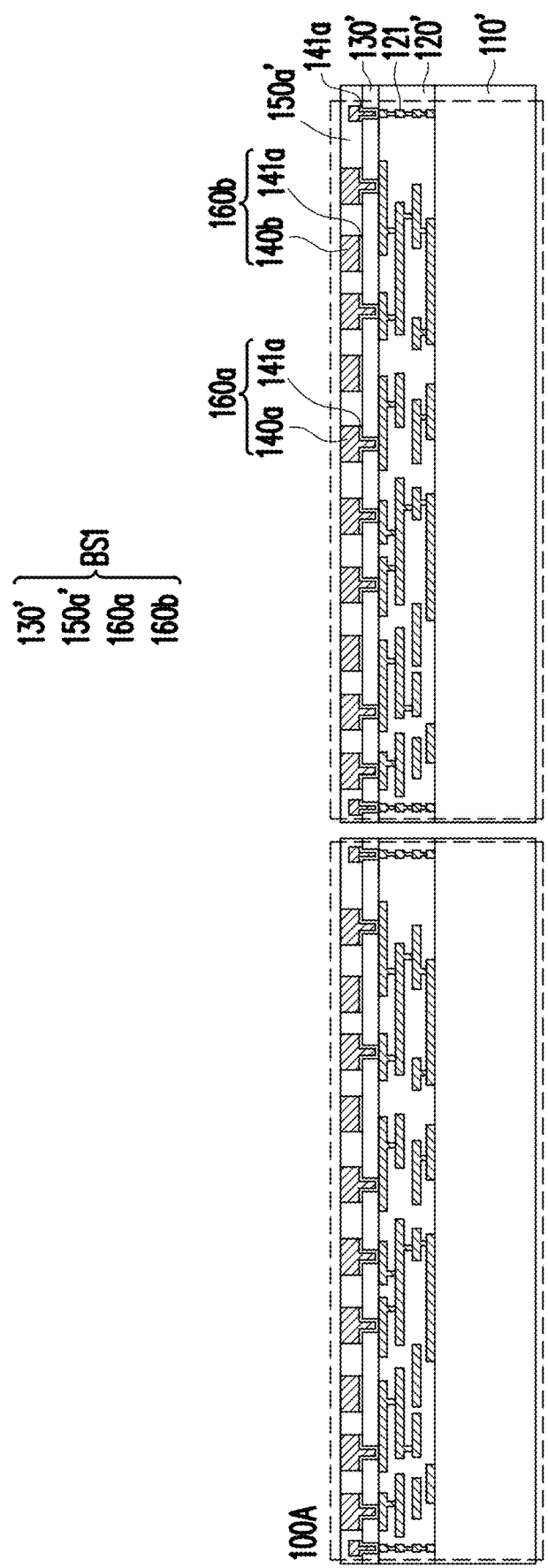

Referring to FIG. 7 and FIG. 8, a wafer sawing process is performed along the scribe lines SL1 of the semiconductor wafer W1 to singulate the semiconductor wafer W1 such that singulated semiconductor dies 100A are obtained. The semiconductor die 100A includes a semiconductor substrate 110', an interconnect structure 120' disposed on the semiconductor substrate 110', and a bonding structure BS1 disposed on the interconnect structure 120'. The bonding structure BS1 may include a first dielectric layer 130', a second dielectric layer 150a' covering the first dielectric layer 130' and first conductors 160a and 160b embedded in the first dielectric layer 130' and the second dielectric layer 150a'. Each of the first conductors 160a includes a conductive barrier layer 141a covering the first dielectric layer 130' and a conductive pillar 140a disposed on the conductive barrier layer 141a, and the conductive pillars 140a are in contact with the second dielectric layer 150a', while each of the first conductors 160b includes a conductive barrier layer 141a covering the first dielectric layer 130' and a conductive pillar 140b disposed on the conductive barrier layer 141a, and the conductive pillars 140b are in contact with the second dielectric layer 150a'.

FIG. 9 through FIG. 16 are cross-sectional views schematically illustrating a process flow for fabricating a semiconductor die in accordance with other embodiments of the present disclosure.

Figure 9:
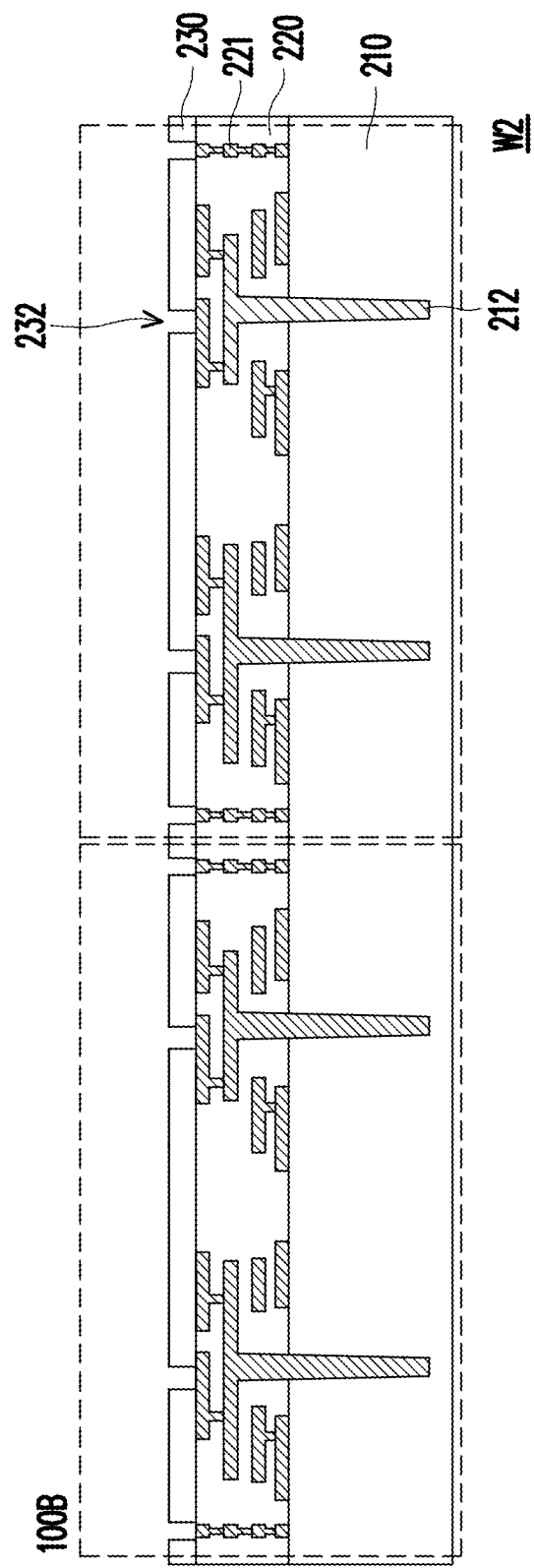
FIG. 9 through FIG. 16 are cross-sectional views schematically illustrating a process flow for fabricating a semiconductor die in accordance with other embodiments of the present disclosure.

Referring to FIG. 9, a semiconductor wafer W2 including semiconductor dies 100B arranged in array is provided. The semiconductor wafer W2 may include a semiconductor substrate 210, an interconnect structure 220 disposed on the semiconductor substrate 210 and a first dielectric layer 230 covering the interconnect structure 220. The semiconductor substrate 210 may be a silicon substrate including active components (e.g., transistors or the like) and passive components (e.g., resistors, capacitors, inductors, or the like) formed therein. The active components and passive components are formed in the semiconductor substrate 210 through front end of line (FEOL) fabrication processes of the semiconductor wafer W2. The semiconductor substrate 210 may further include through semiconductor vias (TSVs) 212. The through semiconductor vias 212 are electrically connected to the interconnect structure 220. The through semiconductor vias 212 may be embedded in the semiconductor substrate 210, and the height of the through semiconductor vias 212 is less than the thickness of the semiconductor substrate 210. The interconnect structure 220 may include interconnect wirings (e.g., copper interconnect wirings) and dielectric layers stacked alternately and first seal ring elements 221 embedded in the interconnect structure 220. The interconnect wirings of the interconnect structure 220 are electrically connected to the active components and/or the passive components in the semiconductor substrate 210. The interconnect structure 220 is formed through back end of line (BEOL) fabrication processes of the semiconductor wafer W2. The first dielectric layer 230 is formed by performing a patterning process to a first dielectric material layer. The first dielectric material layer may include a dielectric material such as silicon oxide, silicon nitride, polymer or a combination thereof, and is formed by any deposition process such as a chemical vapor deposition (CVD) process, a physical vapor deposition (PVD) process or other applicable deposition processes followed by a planarization process such as a chemical mechanical polishing (CMP) process, a mechanical grinding process, combinations thereof or other applicable planarization processes. The first dielectric layer 230 include openings 232 formed by the patterning process. The uppermost layer of the interconnect structure 220 is partially revealed by the openings 232 defined in the first dielectric layer 230. The patterning process may include lithography and etching processes.

Figure 10:
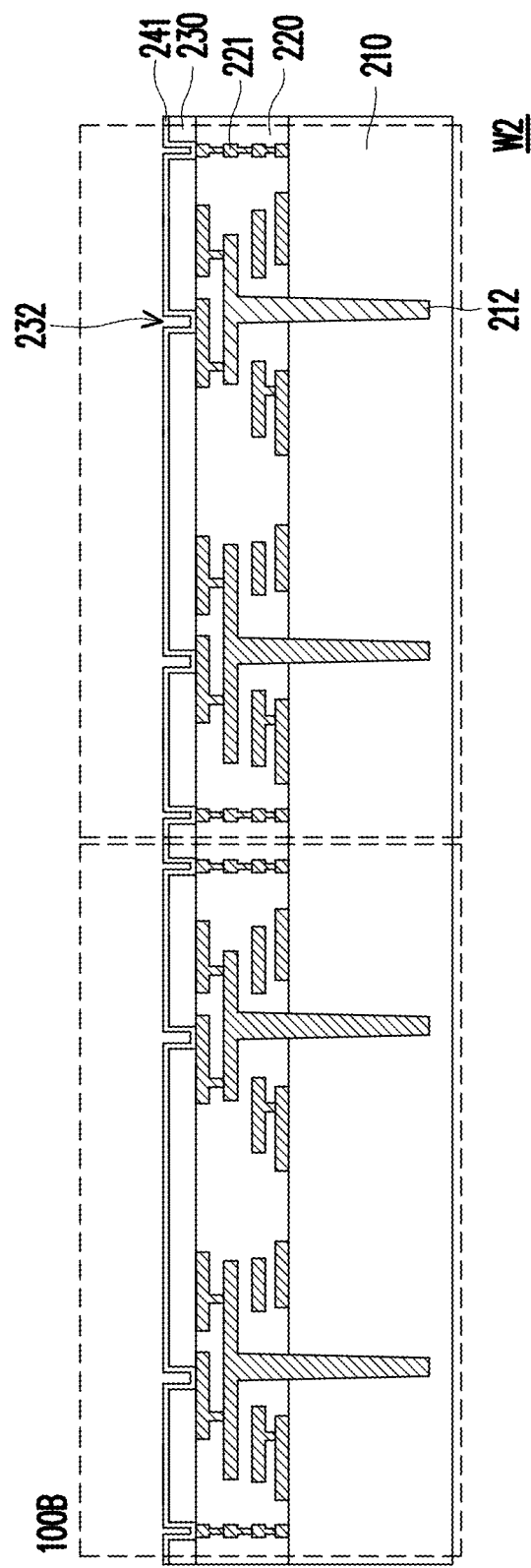
Figure 11:
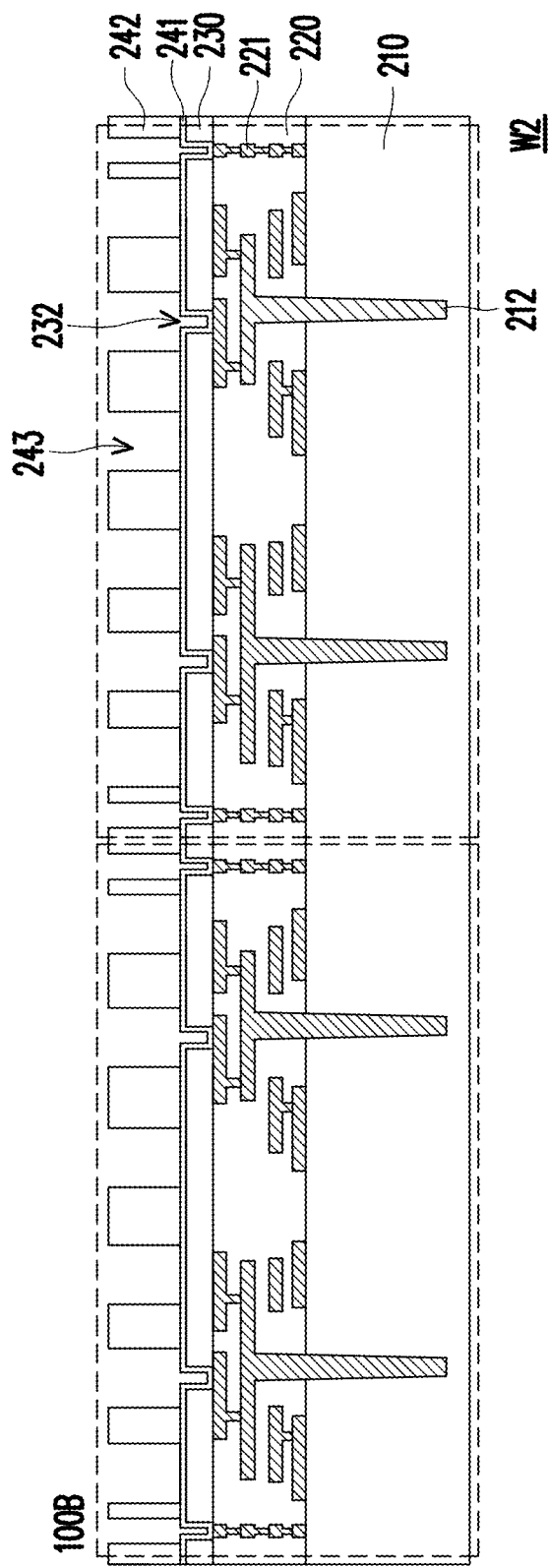

Referring to FIG. 10 and FIG. 11, a seed layer 241 is formed on the first dielectric layer 230 and revealed portions of the uppermost layer of the interconnect structure 220 through a sputtering process. The seed layer 241 may be a metal seed layer such as a Cu seed layer, a Ti seed layer, a Ti/Cu seed layer or the like. A patterned photoresist layer 242 is then formed on the seed layer 241 by a suitable process. The seed layer 241 is partially revealed by openings 243 defined in the patterned photoresist layer 242. The patterned photoresist layer 242 may be formed through a spin coating process followed by a photolithography process such that a predetermined pattern can be transferred onto the patterned photoresist layer 242.

Figure 12:
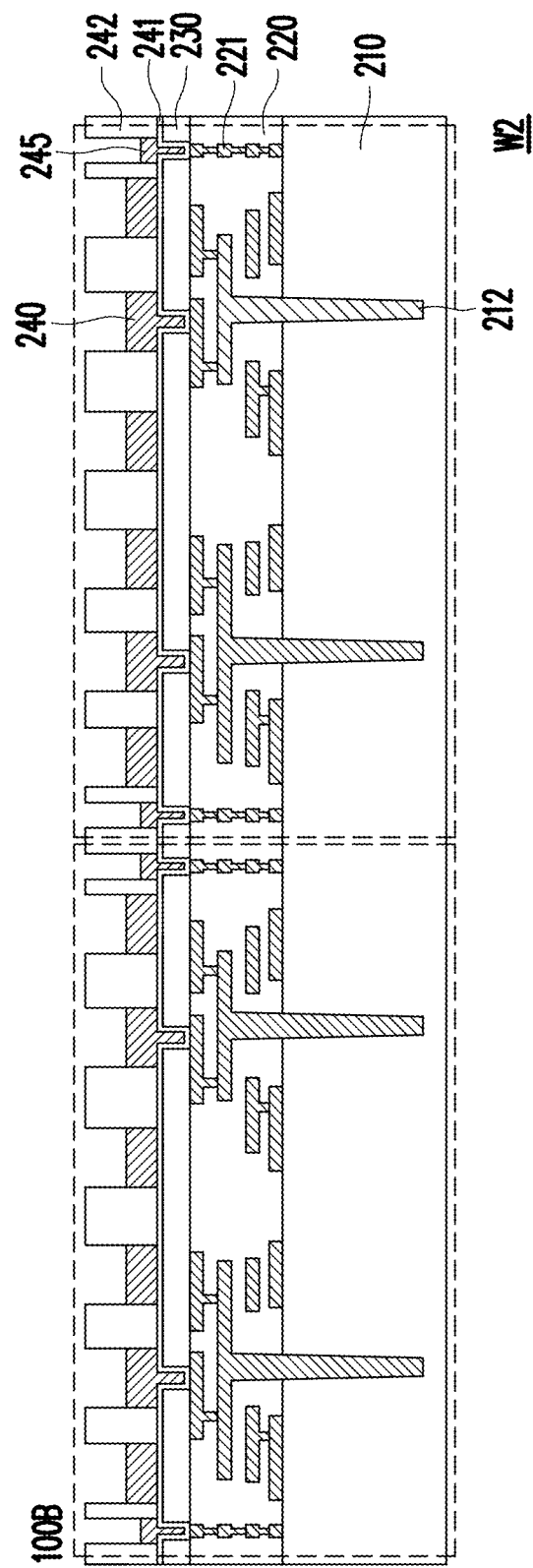

Referring to FIG. 12, at least one plating process is then performed such that a conductive material layer 240 is plated on portions of the seed layer 241 revealed by the openings 243 defined in the patterned photoresist layer 242. The material of the conductive material layer 240 may include copper or other suitable metallic materials. In some embodiments, as illustrated in FIG. 12, the plated conductive material layer 240 partially fills the openings 243 such that top surfaces of the conductive material layer 240 are lower than the top surface of the patterned photoresist layer 242. In some alternative embodiments, not illustrated in figures, the conductive material layer 140 fills the openings 243 such that top surfaces of the conductive material layer 240 are substantially leveled with or slightly higher than the top surface of the patterned photoresist layer 242.

Figure 13:
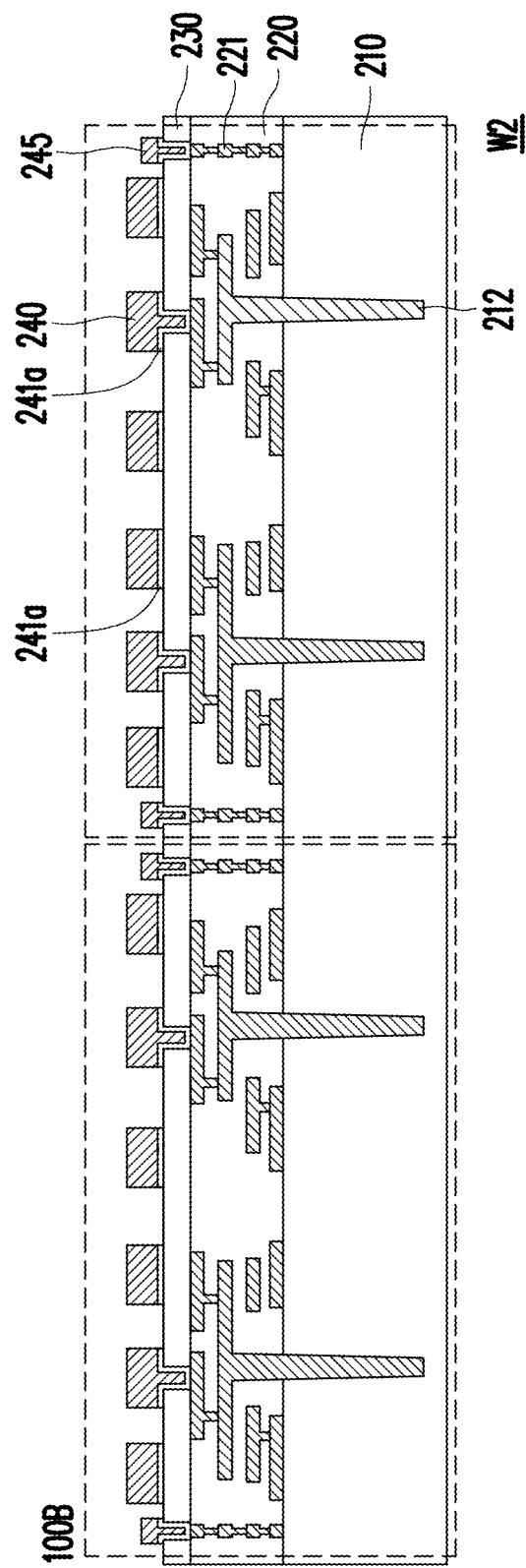

Referring to FIG. 13, a removal process for removing the patterned photoresist layer 242 is performed to reveal the seed layer 241 uncovered by the conductive material layer 240. The removal process may be a stripping process, an ash process, an etch process, combinations thereof, or other applicable removal processes. After removing the patterned photoresist layer 242, a patterning process for partially removing the seed layer 241 may be performed such that a conductive barrier layer 241a with predetermined pattern is formed over the first dielectric layer 230. In some embodiments, the seed layer 241 is patterned by an etching process by using the conductive material layer 240 as an etch mask until portions of the first dielectric layer 230 are revealed. As illustrated in FIG. 13, the conductive barrier layer 241a is formed under the conductive material layer 240.

Figure 14:
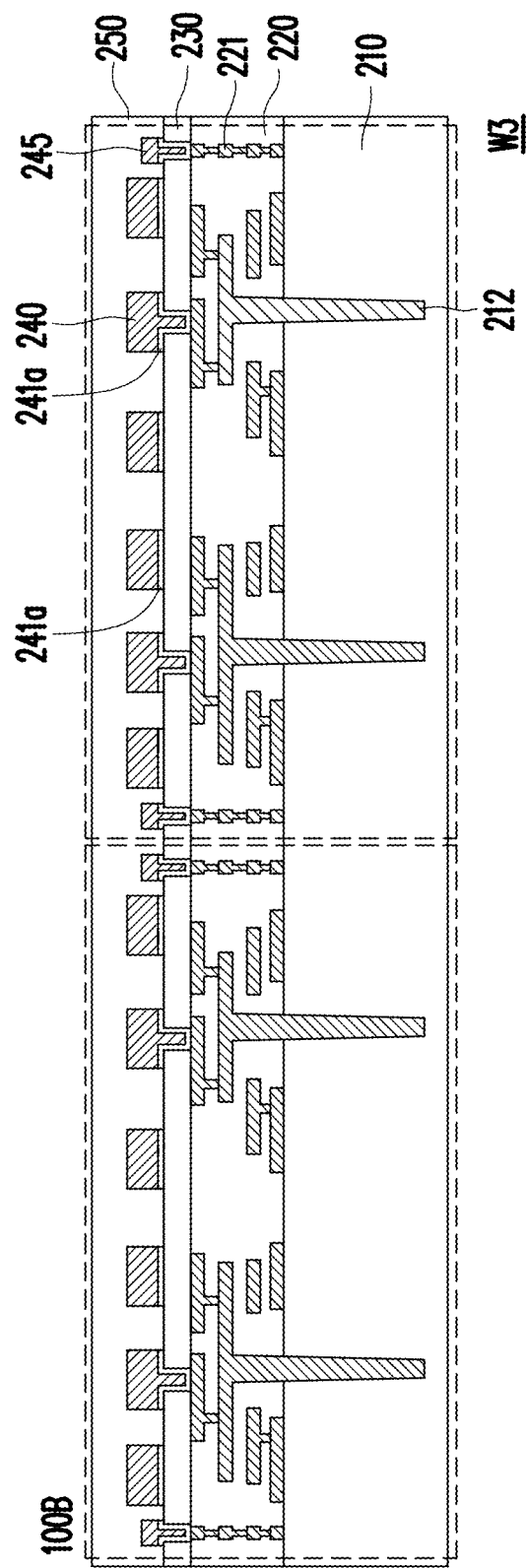
Figure 15:
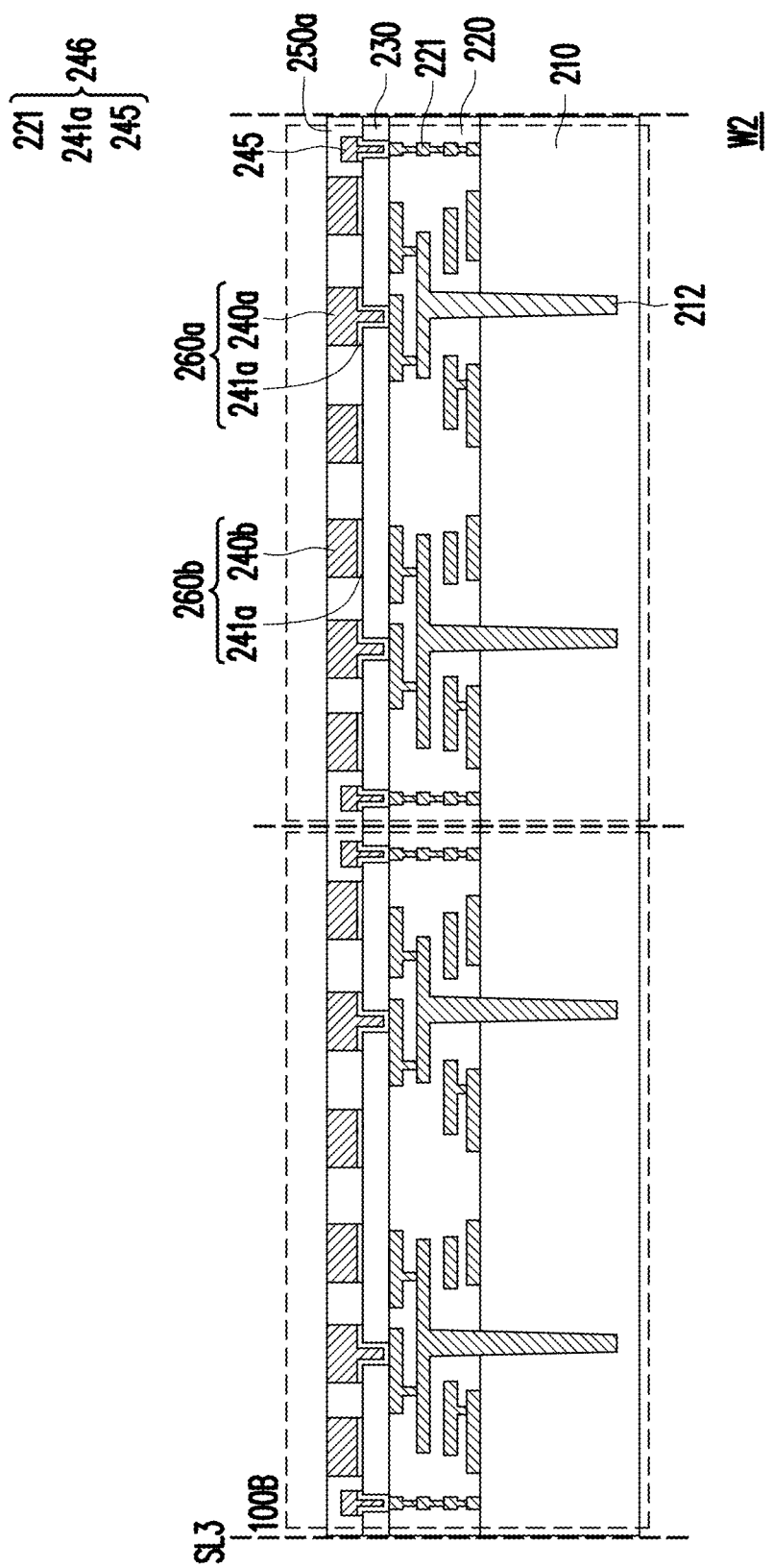

Referring to FIG. 14 and FIG. 15, a second dielectric material layer 250 is formed over the semiconductor substrate 210 to cover the first dielectric layer 230 and the conductive material layer 240. The second dielectric material layer 250 may be formed over the semiconductor substrate 210 by a chemical vapor deposition (CVD) process, a physical vapor deposition (PVD) process or other applicable deposition processes. The second dielectric material layer 250 may include a dielectric material such as silicon oxide, silicon nitride, polymer or a combination thereof. The dielectric material of the second dielectric material layer 250 may be the same as or different from the first dielectric layer 230. A planarization process is then performed to remove a portion of the second dielectric material layer 250 and a portion of the conductive material layer 240, so that a second dielectric layer 250a, conductive pillars 240a, and conductive pillars 240b and second seal ring elements 245 are formed. In some embodiments, top surfaces of the second seal ring elements 245 are lower than the top surfaces of the conductive pillars 240a and 240b. In some alternative embodiments, top surfaces of the second seal ring elements 245 are substantially leveled with the top surfaces of the conductive pillars 240a and 240b. The planarization process may be a chemical mechanical polishing (CMP) process, a mechanical grinding process, combinations thereof or other applicable planarization processes. After performing the planarization process, the conductive pillars 240a and the conductive pillars 240b are embedded in and laterally encapsulated by the second dielectric layer 250a. In some embodiments, as illustrated in FIG. 15, the top surfaces of conductive pillars 240a and the conductive pillars 240b are substantially leveled with the top surface of the second dielectric layer 250a. In some alternative embodiments, not illustrated in figures, the top surfaces of conductive pillars 240a and the conductive pillars 240b are slightly lower or slightly higher than the top surface of the second dielectric layer 250a. Each of the conductive pillars 240a and the conductive barrier layer 241a disposed under the conductive pillars 240a constitute a first conductor 260a, while each of the conductive pillars 240b and the conductive barrier layer 241a disposed under the conductive pillars 240b constitute a first conductor 260b. In addition, each of the second seal ring elements 245, the conductive barrier layer 241a disposed under the second seal ring elements 245 and the first seal ring element 221 disposed under the second seal ring elements 245 constitute a seal ring structure 246.

Figure 16:
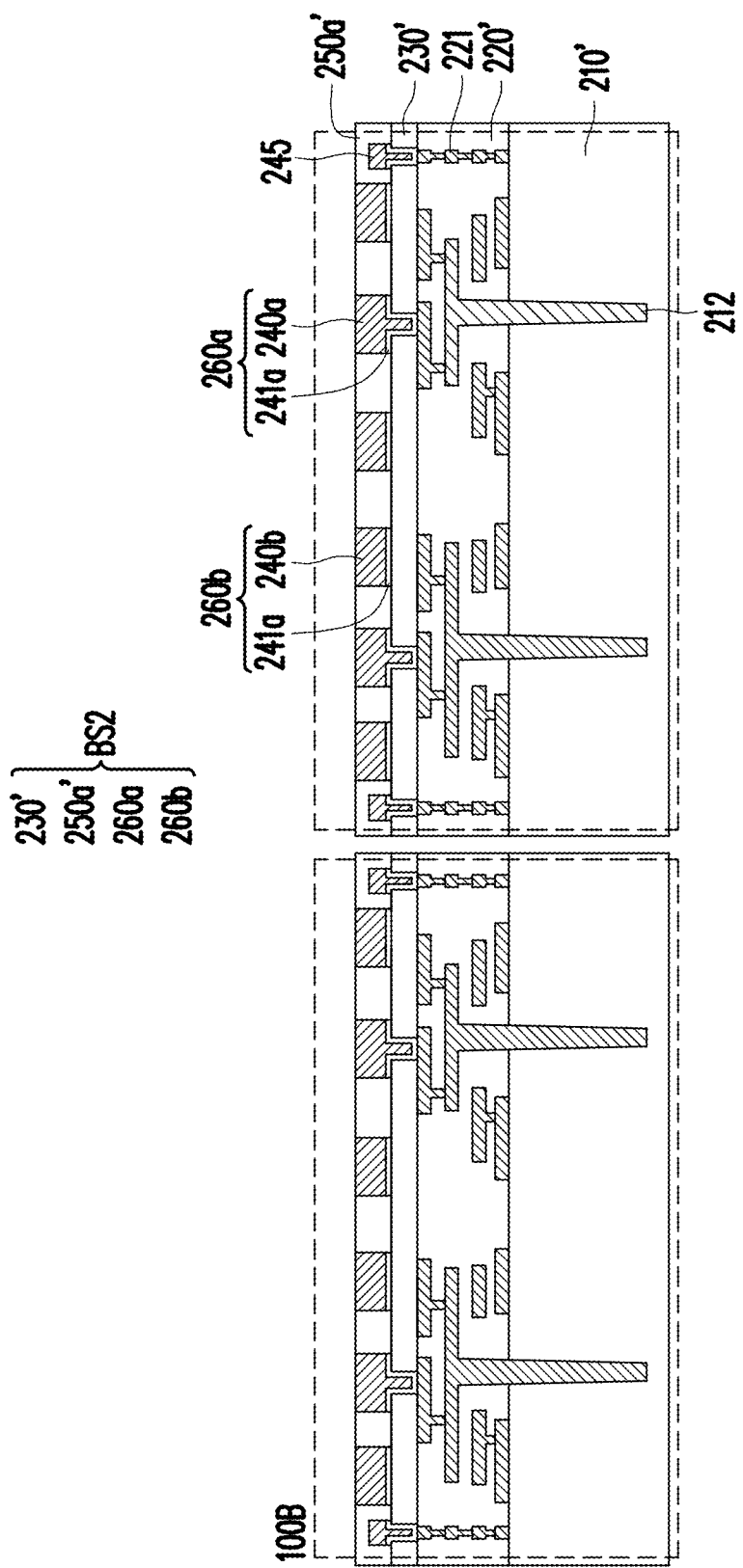

Referring to FIG. 15 and FIG. 16, a wafer sawing process is performed along the scribe lines SL2 of the semiconductor wafer W2 to singulate the semiconductor wafer W2 such that singulated semiconductor dies 100B are obtained. The semiconductor die 100B includes a semiconductor substrate 210', an interconnect structure 220' disposed on the semiconductor substrate 210', and a bonding structure BS2 disposed on the interconnect structure 220'. The semiconductor substrate 210' may include through semiconductor vias (TSVs) 212. The through semiconductor vias 212 are electrically connected to the interconnect structure 220'. The bonding structure BS2 may include a first dielectric layer 230', a second dielectric layer 250a' covering the first dielectric layer 230' and first conductors 260a and 260b embedded in the first dielectric layer 230' and the second dielectric layer 250a'. Each of the first conductors 260a includes a conductive barrier layer 241a covering the first dielectric layer 230' and a conductive pillar 240a disposed on the conductive barrier layer 241a, and the conductive pillars 240a are in contact with the second dielectric layer 250a', while each of the first conductors 260b includes a conductive barrier layer 241a covering the first dielectric layer 230' and a conductive pillar 240b disposed on the conductive barrier layer 241a, and the conductive pillars 240b are in contact with the second dielectric layer 250a'.

FIG. 17 through FIG. 25 are cross-sectional views schematically illustrating a process flow for fabricating a semiconductor die in accordance with still other embodiments of the present disclosure.

Figure 17:
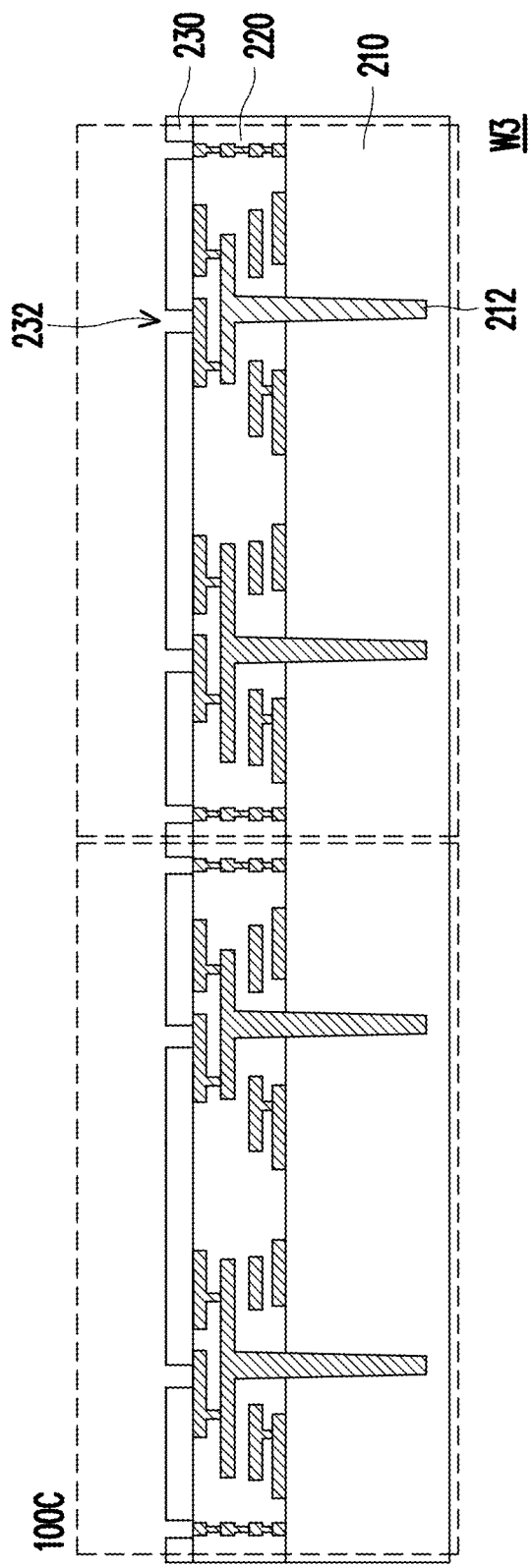
FIG. 17 through FIG. 25 are cross-sectional views schematically illustrating a process flow for fabricating a semiconductor die in accordance with still other embodiments of the present disclosure.

Referring to FIG. 17, a semiconductor wafer W3 including semiconductor dies 100C arranged in array is provided. The semiconductor wafer W3 may include a semiconductor substrate 210, an interconnect structure 220 disposed on the semiconductor substrate 210 and a first dielectric layer 230 covering the interconnect structure 220. The semiconductor substrate 210 may be a silicon substrate including active components (e.g., transistors or the like) and passive components (e.g., resistors, capacitors, inductors, or the like) formed therein. The active components and passive components are formed in the semiconductor substrate 210 through front end of line (FEOL) fabrication processes of the semiconductor wafer W2. The semiconductor substrate 210 may further include through semiconductor vias (TSVs) 212. The through semiconductor vias 212 are electrically connected to the interconnect structure 220. The through semiconductor vias 212 may be embedded in the semiconductor substrate 210, and the height of the through semiconductor vias 212 is less than the thickness of the semiconductor substrate 210. The interconnect structure 220 may include interconnect wirings (e.g., copper interconnect wirings) and dielectric layers stacked alternately and first seal ring elements 221 embedded in the interconnect structure 220. The interconnect wirings of the interconnect structure 220 are electrically connected to the active components and/or the passive components in the semiconductor substrate 210. The interconnect structure 220 is formed through back end of line (BEOL) fabrication processes of the semiconductor wafer W2. The first dielectric layer 230 is formed by performing a patterning process to a first dielectric material layer. The first dielectric material layer may include a dielectric material such as silicon oxide, silicon nitride, polymer or a combination thereof, and is formed by any deposition process such as a chemical vapor deposition (CVD) process, a physical vapor deposition (PVD) process or other applicable deposition processes followed by a planarization process such as a chemical mechanical polishing (CMP) process, a mechanical grinding process, combinations thereof or other applicable planarization processes. The first dielectric layer 230 include openings 232 formed by the patterning process. The uppermost layer of the interconnect structure 220 is partially revealed by the openings 232 defined in the first dielectric layer 230. The patterning process may include lithography and etching processes.

Figure 18:
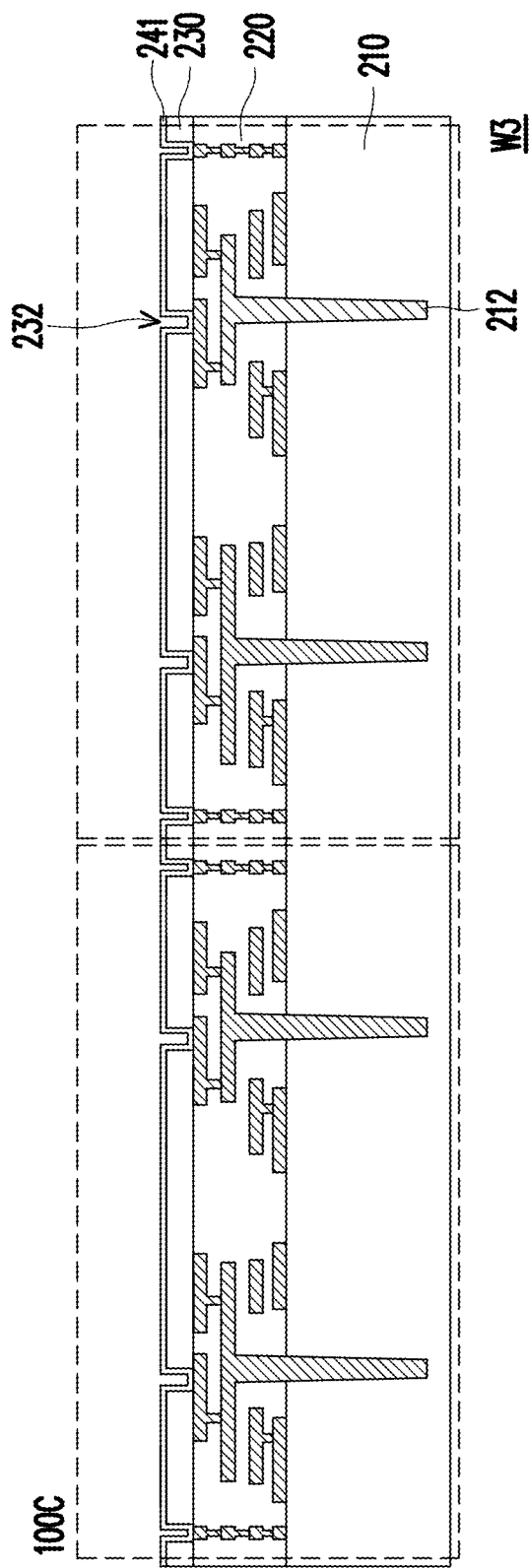
Figure 19:
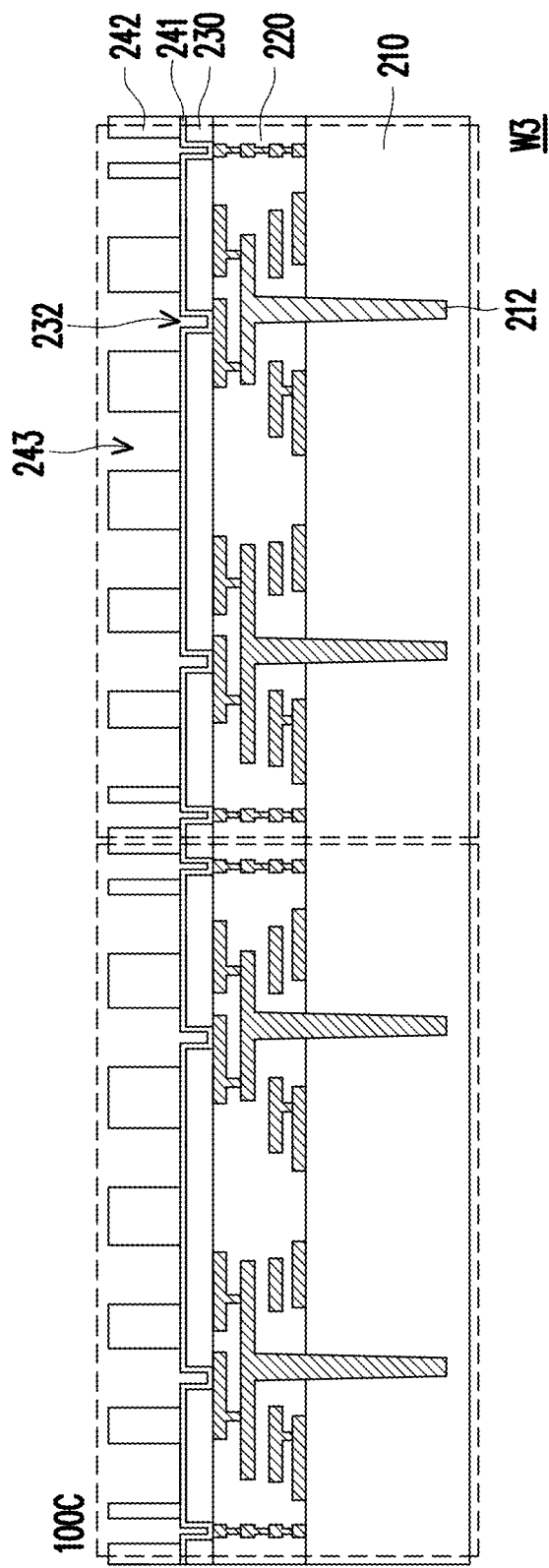

Referring to FIG. 18 and FIG. 19, a seed layer 241 is formed on the first dielectric layer 230 and revealed portions of the uppermost layer of the interconnect structure 220 through a sputtering process. The seed layer 241 may be a metal seed layer such as a Cu seed layer, a Ti seed layer, a Ti/Cu seed layer or the like. A patterned photoresist layer 242 is then formed on the seed layer 241 by a suitable process. The seed layer 241 is partially revealed by openings 243 defined in the patterned photoresist layer 242. The patterned photoresist layer 242 may be formed through a spin coating process followed by a photolithography process such that a predetermined pattern can be transferred onto the patterned photoresist layer 242.

Figure 20:
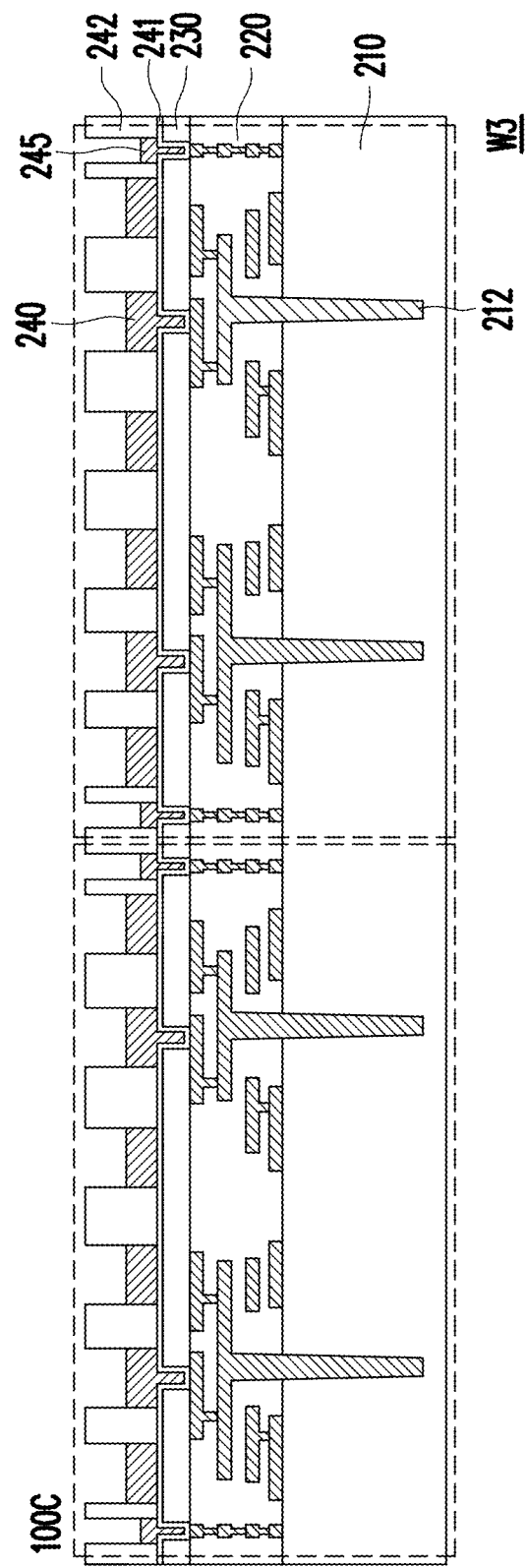

Referring to FIG. 20, at least one plating process is then performed such that a conductive material layer 240 is plated on portions of the seed layer 241 revealed by the openings 243 defined in the patterned photoresist layer 242. The material of the conductive material layer 240 may include copper or other suitable metallic materials. In some embodiments, as illustrated in FIG. 20, the plated conductive material layer 240 partially fills the openings 243 such that top surfaces of the conductive material layer 240 are lower than the top surface of the patterned photoresist layer 242. In some alternative embodiments, not illustrated in figures, the conductive material layer 140 fills the openings 243 such that top surfaces of the conductive material layer 240 are substantially leveled with or slightly higher than the top surface of the patterned photoresist layer 242.

Figure 21:
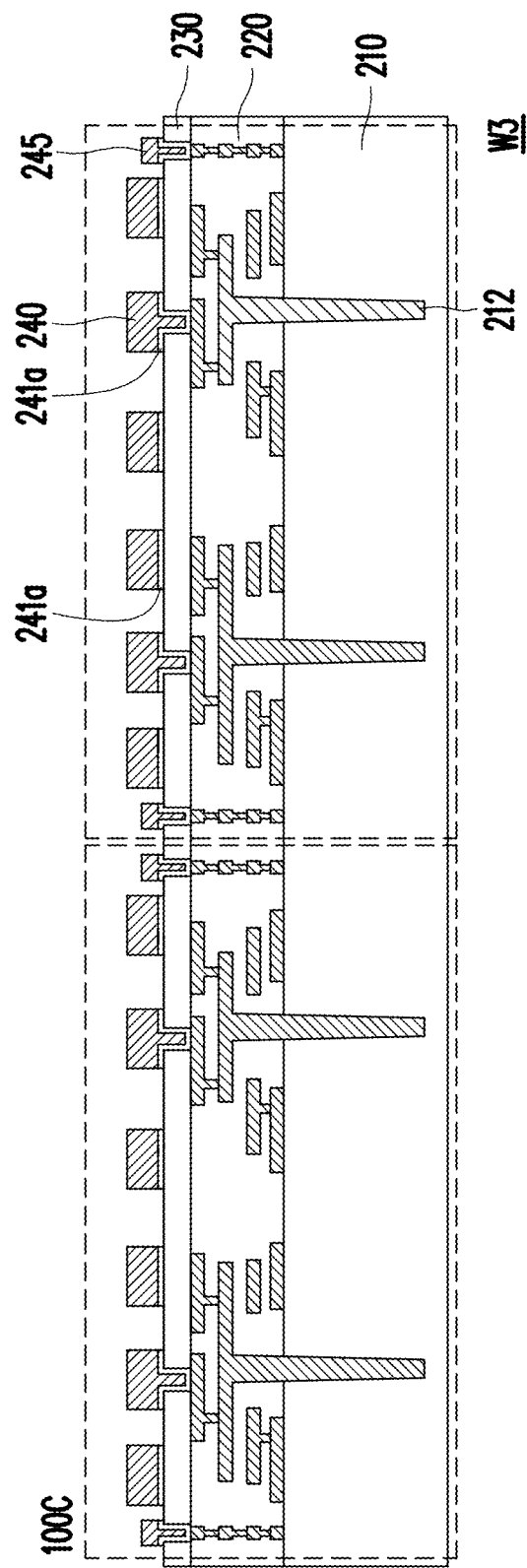

Referring to FIG. 21, a removal process for removing the patterned photoresist layer 242 is performed to reveal the seed layer 241 uncovered by the conductive material layer 240. The removal process may be a stripping process, an ash process, an etch process, combinations thereof, or other applicable removal processes. After removing the patterned photoresist layer 242, a patterning process for partially removing the seed layer 241 may be performed such that a conductive barrier layer 241a with predetermined pattern is formed over the first dielectric layer 230. In some embodiments, the seed layer 241 is patterned by an etching process by using the conductive material layer 240 as an etch mask until portions of the first dielectric layer 230 are revealed. As illustrated in FIG. 21, the conductive barrier layer 241a is formed under the conductive material layer 240.

Figure 22:
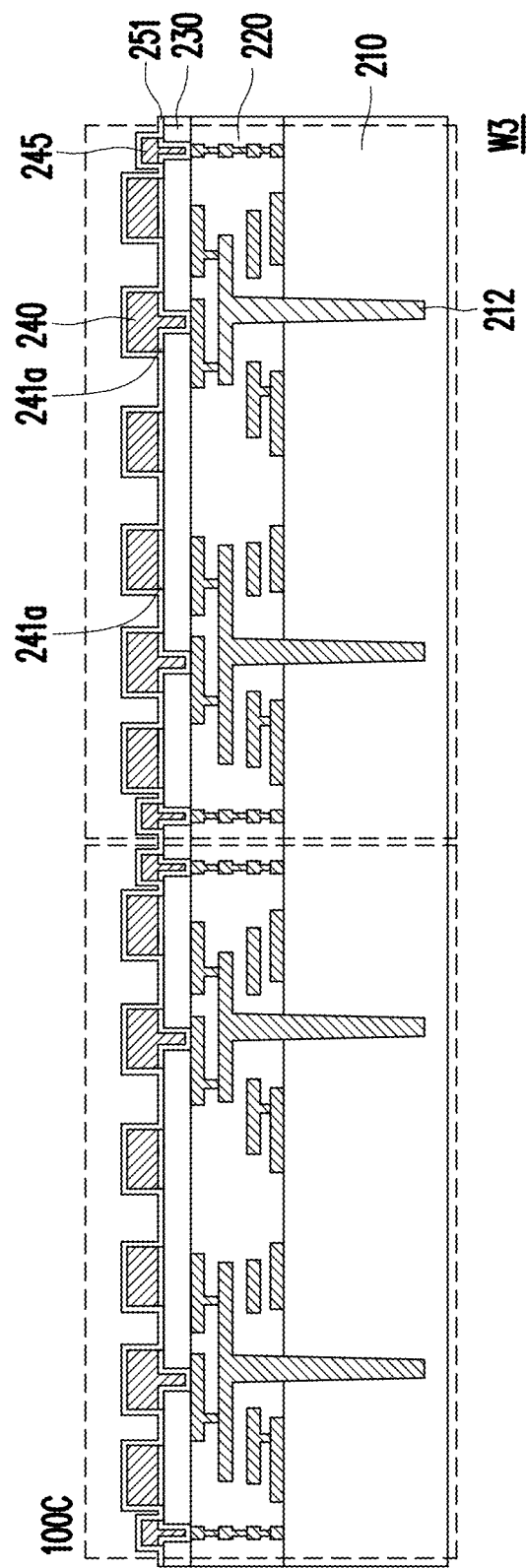

Referring to FIG. 22, a barrier dielectric material layer 251 is formed on the conductive material layer 240 and revealed portions of the first dielectric layer 230. The barrier dielectric material layer 251 may include a dielectric material such as nitride, for example, TiN, and is formed by any deposition process such as a chemical vapor deposition (CVD) process, a physical vapor deposition (PVD) process or other applicable deposition processes.

Figure 23:
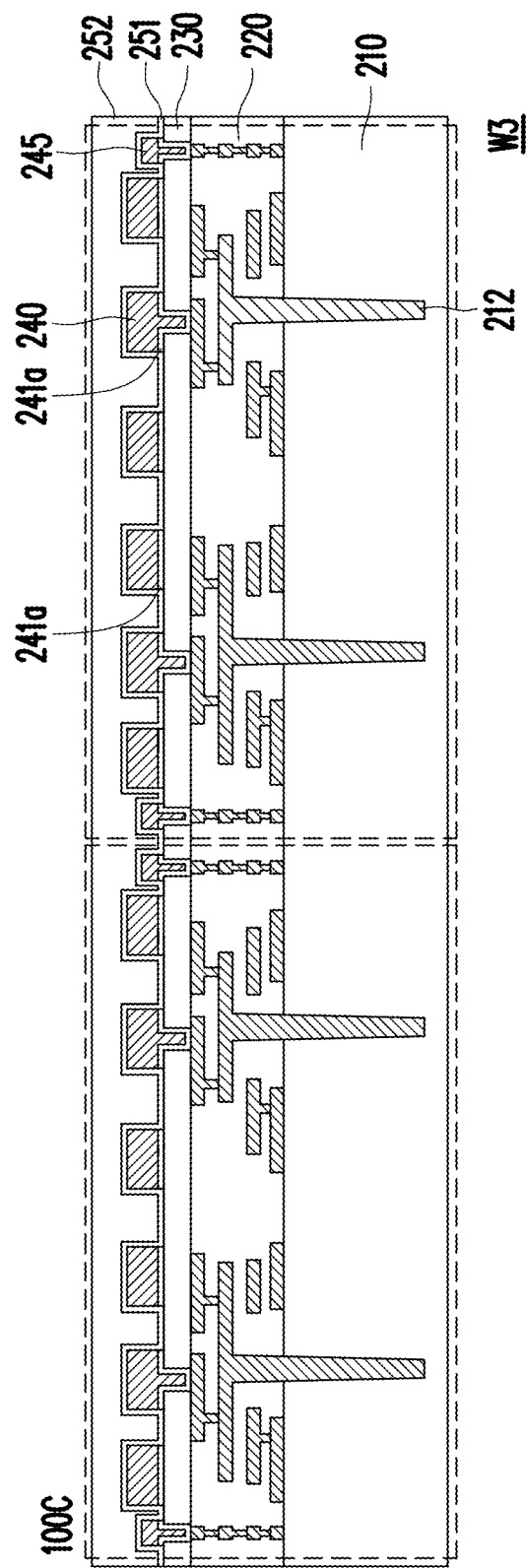
Figure 24:
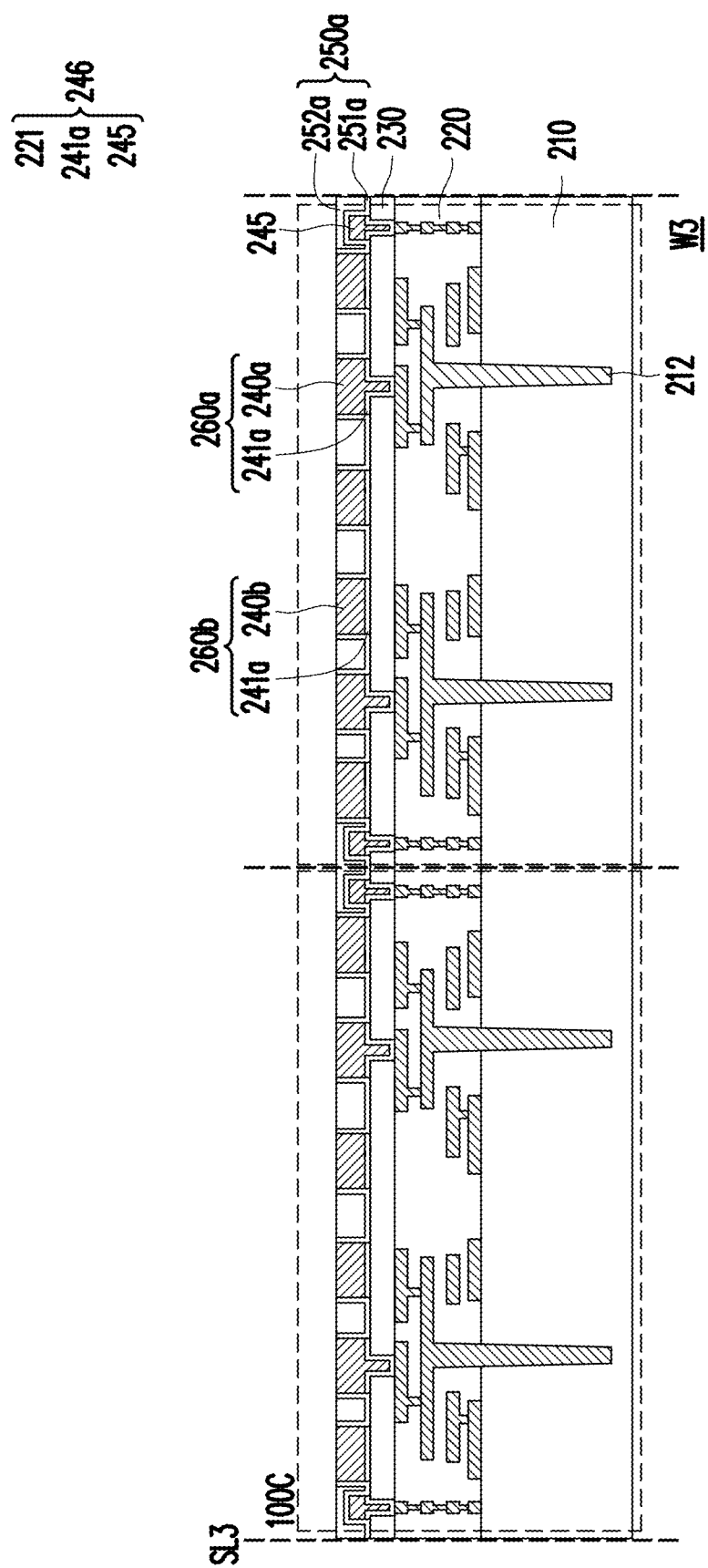

Referring to FIG. 23 and FIG. 24, a second dielectric material layer 252 is formed over the semiconductor substrate 210 to cover the barrier dielectric material layer 251. The second dielectric material layer 252 may be formed over the semiconductor substrate 210 by a chemical vapor deposition (CVD) process, a physical vapor deposition (PVD) process or other applicable deposition processes. The second dielectric material layer 252 may include a dielectric material different from the material of the barrier dielectric material layer 251, such as silicon oxide, silicon nitride, polymer or a combination thereof. The dielectric material of the second dielectric material layer 252 may be the same as or different from the first dielectric layer 230. A planarization process is then performed to remove a portion of the barrier dielectric material layer 251, a portion of the second dielectric material layer 252 and a portion of the conductive material layer 240, so that a second dielectric layer 250a including a barrier portion 251a and a dielectric portion 252a, conductive pillars 240a, and conductive pillars 240b and second seal ring elements 245 are formed. In some embodiments, top surfaces of the second seal ring elements 245 are lower than the top surfaces of the conductive pillars 240a and 240b. In some alternative embodiments, top surfaces of the second seal ring elements 245 are substantially leveled with the top surfaces of the conductive pillars 240a and 240b. The planarization process may be a chemical mechanical polishing (CMP) process, a mechanical grinding process, combinations thereof or other applicable planarization processes. After performing the planarization process, the conductive pillars 240a and the conductive pillars 240b are embedded in and laterally encapsulated by the second dielectric layer 250a. In some embodiments, as illustrated in FIG. 15, the top surfaces of conductive pillars 240a and the conductive pillars 240*b* are substantially leveled with the top surface of the second dielectric layer 250*a*. In some alternative embodiments, not illustrated in figures, the top surfaces of conductive pillars 240*a* and the conductive pillars 240*b* are slightly lower or slightly higher than the top surface of the second dielectric layer 250*a*. Each of the conductive pillars 240*a* and the conductive barrier layer 241*a* disposed under the conductive pillars 240*a* constitute a first conductor 260*a*, while each of the conductive pillars 240*b* and the conductive barrier layer 241*a* disposed under the conductive pillars 240*b* constitute a first conductor 260*b*. In addition, each of the second seal ring elements 245, the conductive barrier layer 241*a* disposed under the second seal ring elements 245 and the first seal ring element 221 disposed under the second seal ring elements 245 constitute a seal ring structure 246. The dielectric portion 252*a* is spaced apart from the first dielectric layer 230 by the barrier portion 251*a*. The conductive pillars 240*a* and 240*b* are spaced apart from the dielectric portion 252*a* by the barrier portion 251*a*. The barrier portion 251*a* is in contact with the conductive barrier layer 241*a*.

Figure 25:
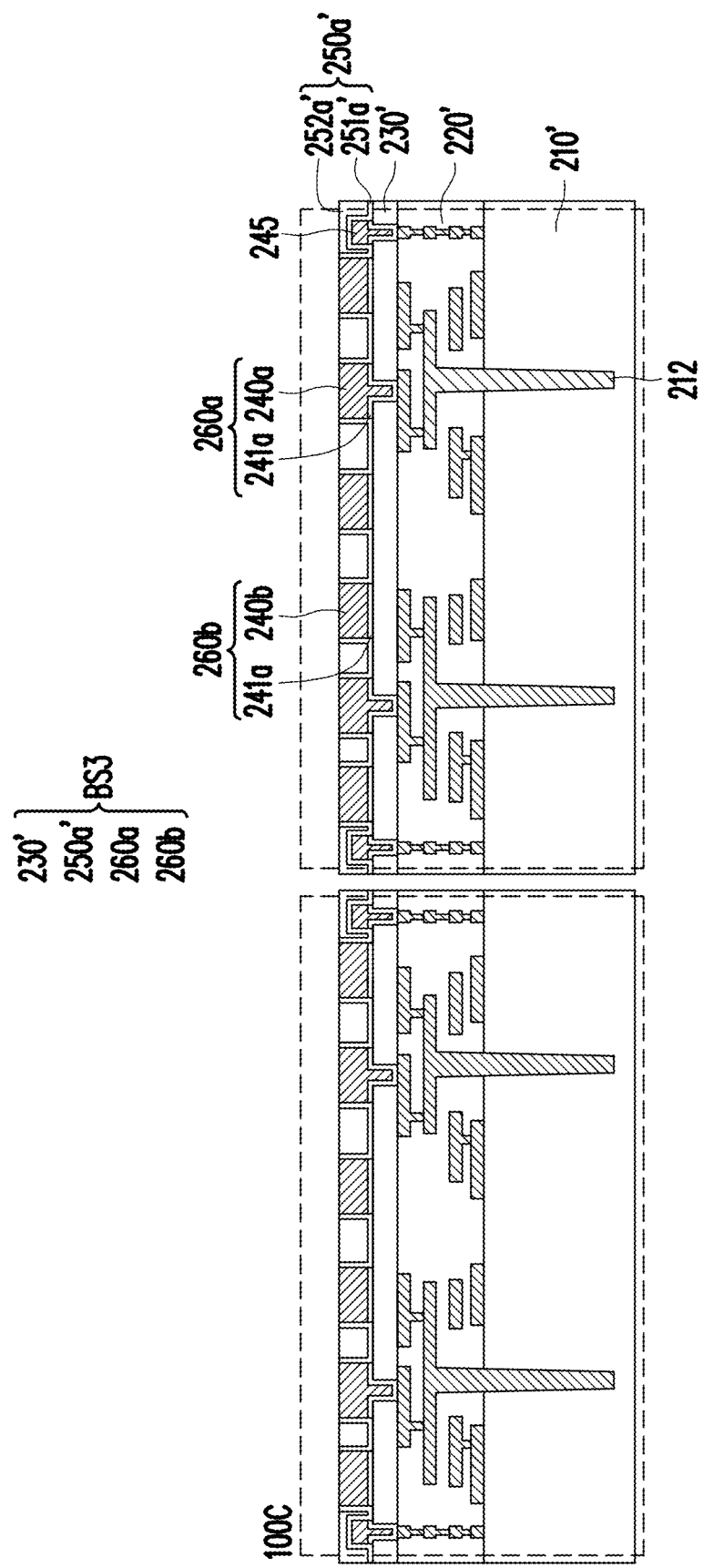

Referring to FIG. 24 and FIG. 25, a wafer sawing process is performed along the scribe lines SL3 of the semiconductor wafer W3 to singulate the semiconductor wafer W3 such that singulated semiconductor dies 100C are obtained. The semiconductor die 100C includes a semiconductor substrate 210', an interconnect structure 220' disposed on the semiconductor substrate 210', and a bonding structure BS3 disposed on the interconnect structure 220'. The semiconductor substrate 210' may include through semiconductor vias (TSVs) 212. The through semiconductor vias 212 are electrically connected to the interconnect structure 220'. The bonding structure BS3 may include a first dielectric layer 230', a second dielectric layer 250*a*' covering the first dielectric layer 230' and first conductors 260*a* and 260*b* embedded in the first dielectric layer 230' and the second dielectric layer 250*a*'. Each of the first conductors 260*a* includes a conductive barrier layer 241*a* covering the first dielectric layer 230' and a conductive pillar 240*a* disposed on the conductive barrier layer 241*a*, and the conductive pillars 240*a* are in contact with the second dielectric layer 250*a*', while each of the first conductors 260*b* includes a conductive barrier layer 241*a* covering the first dielectric layer 230' and a conductive pillar 240*b* disposed on the conductive barrier layer 241*a*, and the conductive pillars 240*b* are in contact with the second dielectric layer 250*a*'. The second dielectric layer 250*a*' includes a barrier portion 251*a*' and a dielectric portion 252*a*'. The dielectric portion 252*a*' is spaced apart from the first dielectric layer 230' by the barrier portion 251*a*', the conductive pillars 240*a* and 240*b* are spaced apart from the dielectric portion 252*a*' by the barrier portion 251*a*' and the barrier portion 251*a*' is in contact with the conductive barrier layer 241*a*.

FIG. 26 through FIG. 37 are cross-sectional views schematically illustrating a process flow for fabricating a semiconductor structure in accordance with some embodiments of the present disclosure.

Figure 26:
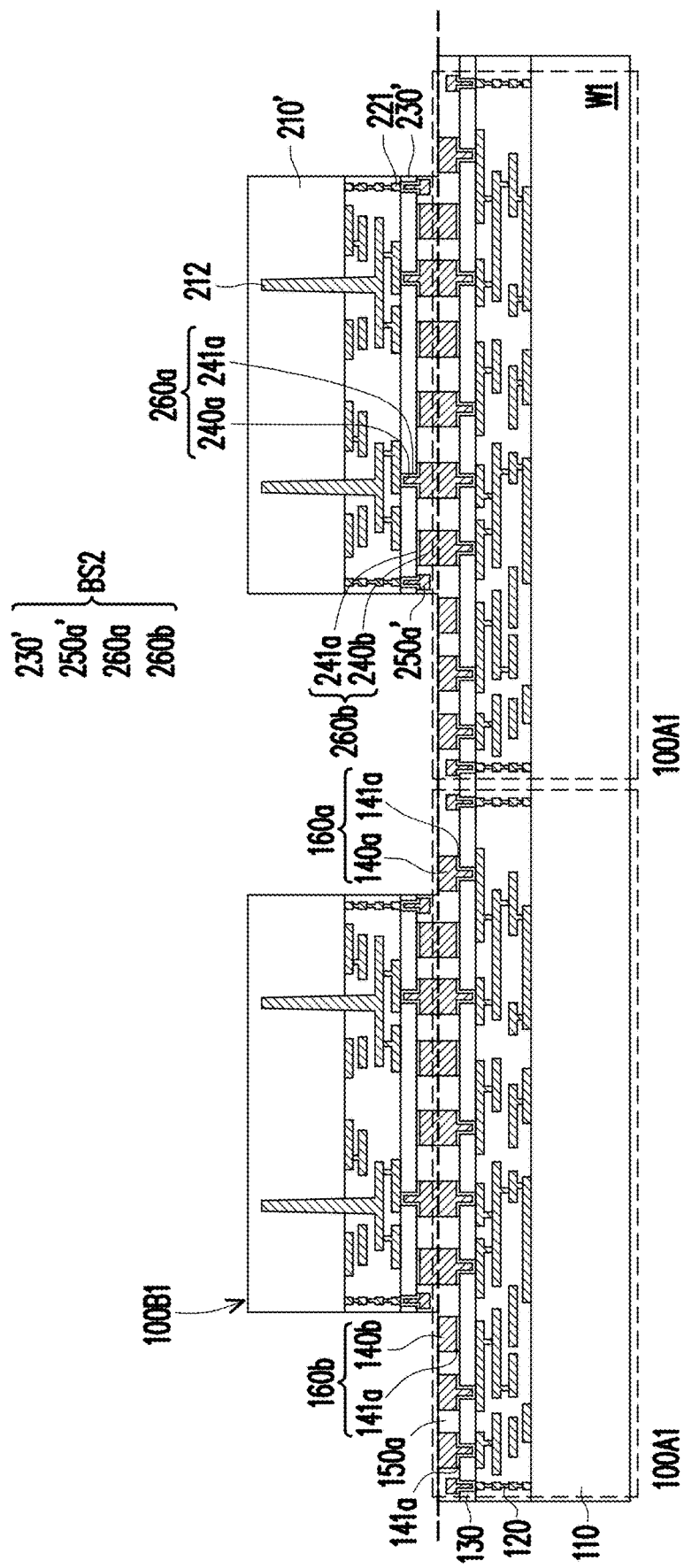
FIG. 26 through FIG. 37 are cross-sectional views schematically illustrating a process flow for fabricating a semiconductor structure in accordance with some embodiments of the present disclosure.

Referring to FIG. 26, an SoIC component including semiconductor wafer W1 including bottom tier semiconductor dies 100A1 arranged in array and top tier semiconductor dies 100B1 is provided. The semiconductor wafer W1 is fabricated by the processes illustrated in FIG. 1 through FIG. 7, and the top tier semiconductor die 100B1 is fabricated by the processes illustrated in FIG. 9 through FIG. 16. In some embodiments, a face-to-face bonding process is performed to bond the bottom tier semiconductor die 100A1 with the top tier semiconductor die 100B1. A bonding interface between the bottom tier semiconductor die 100A1 with the top tier semiconductor die 100B1 may include dielectric-to-dielectric bonding interfaces and metal-to-metal bonding interfaces. In some embodiments, a chip-to-wafer bonding process is performed to bond the singulated top tier semiconductor die 100B1 with the bottom tier semiconductor die 100A1 in the semiconductor wafer W1.

Figure 27:
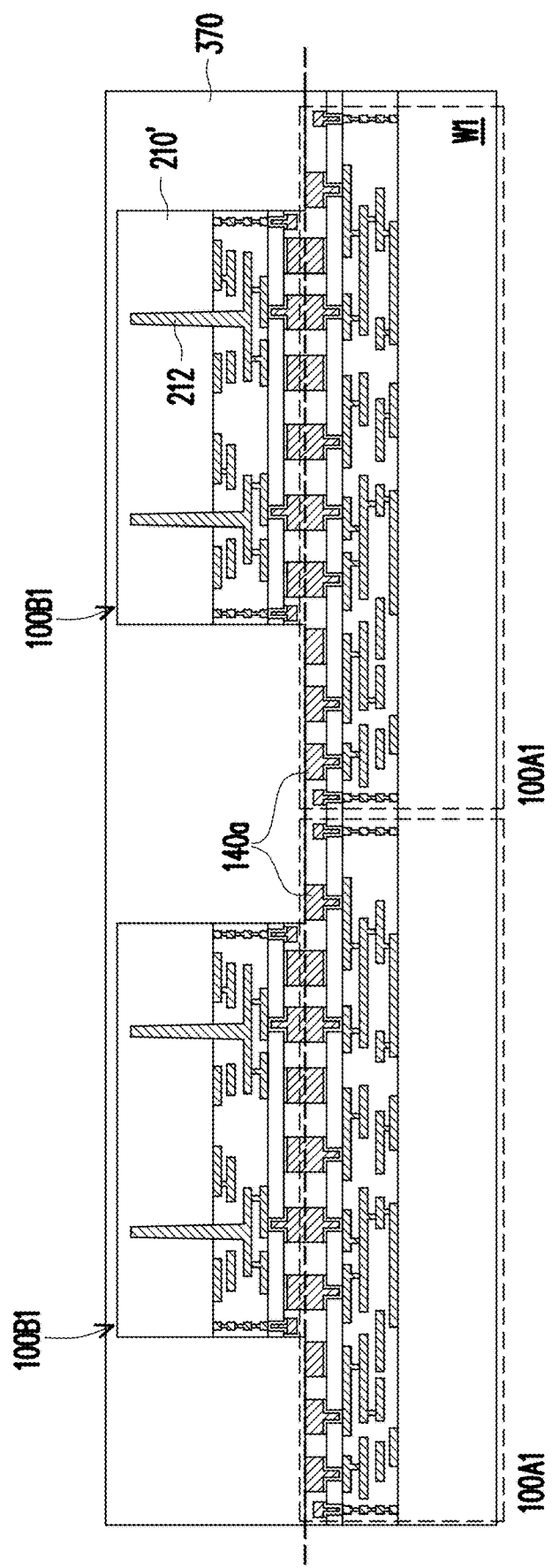

Referring to FIG. 27, an encapsulant material layer 370 is formed over the semiconductor wafer W1 to cover the bottom tier semiconductor dies 100A1 and the top tier semiconductor die 100B1. In some embodiments, a material of the encapsulant material layer 370 includes a molding compound. The molding compound may include a resin (e.g., epoxy resin) and a filler contained in the resin. In some alternatively embodiments, a material of the encapsulant material layer 370 includes an oxide or a nitride, such as silicon oxide, silicon nitride or a combination thereof. The encapsulant material layer 370 may be formed by spin-coating, lamination, deposition or the like.

Figure 28:
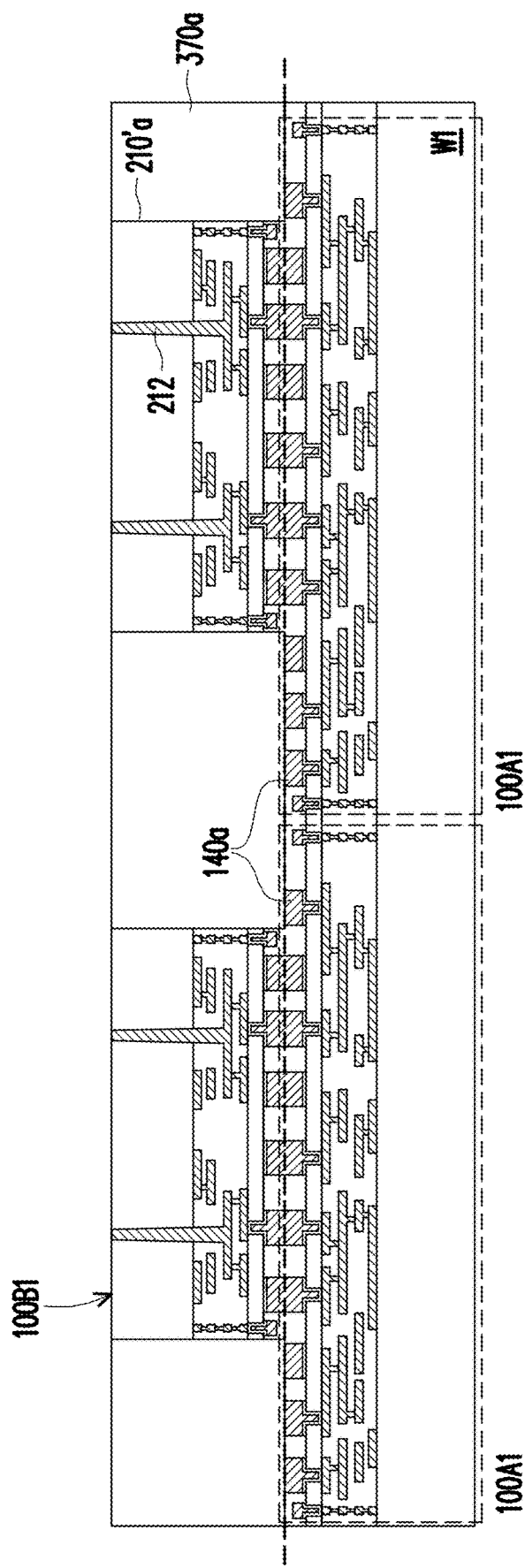

Referring to FIG. 28, a planarization process such as a chemical mechanical polishing (CMP) process, a mechanical grinding process, combinations thereof or other applicable planarization processes is then performed to obtain an insulating encapsulation 370*a*. The insulating encapsulation 370*a* overlays the bottom tier semiconductor dies 100A1, and is formed around the top tier semiconductor dies 100B1 to encapsulate the top tier semiconductor die 100B1. A portion of the semiconductor substrate 210' in the top tier semiconductor die 100B1 is also removed by the planarization process to form a semiconductor substrate 210'*a*, such that through semiconductor vias 212 are revealed.

Figure 29:
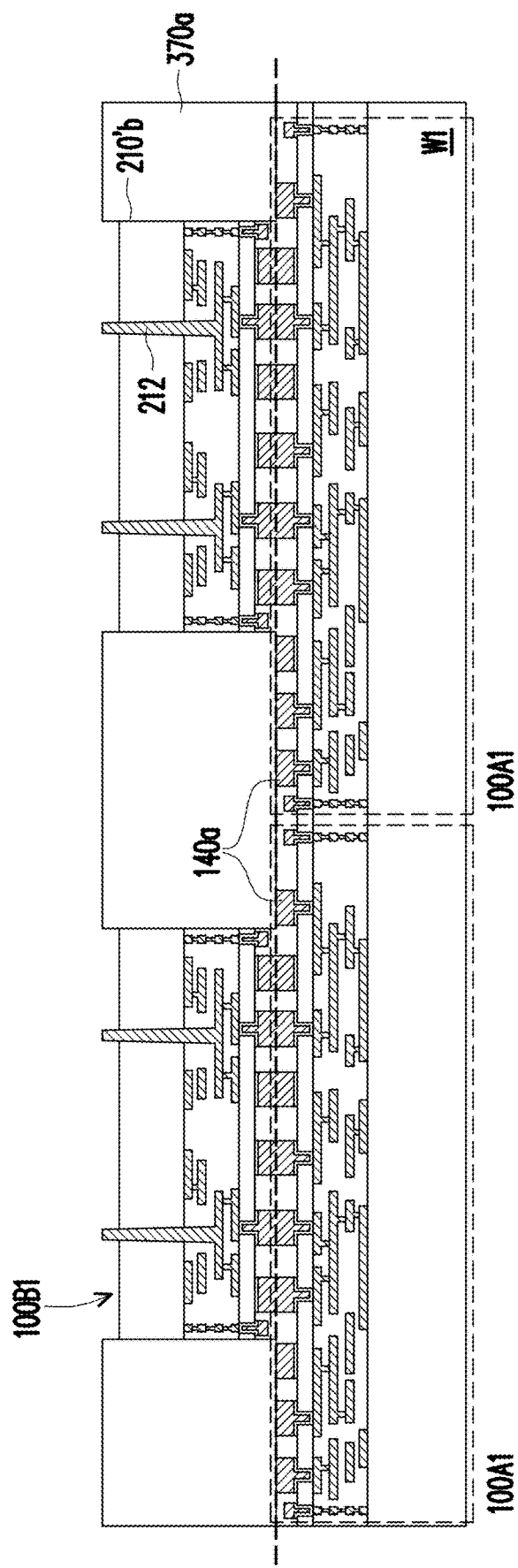

Referring to FIG. 29, a portion of the semiconductor substrate 210'*a* in the top tier semiconductor die 100B1 is further removed to form a semiconductor substrate 210'*b* by a suitable process such as a patterning process including lithography followed by etching processes. A top surface of the semiconductor substrate 210'*b* is lower than a top surface of the insulating encapsulation 370*a* and top surfaces of the through semiconductor vias 212, such that top ends of the through semiconductor vias 212 protrude above the top surface of the semiconductor substrate 210'*b*.

Figure 30:
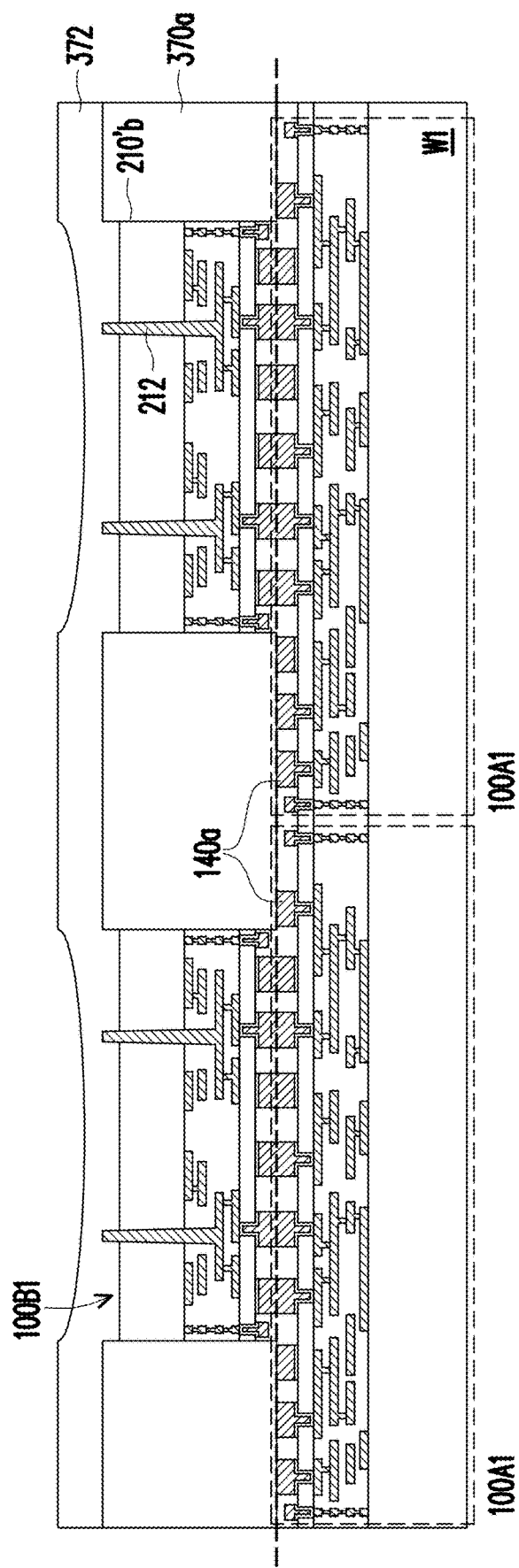
Figure 31:
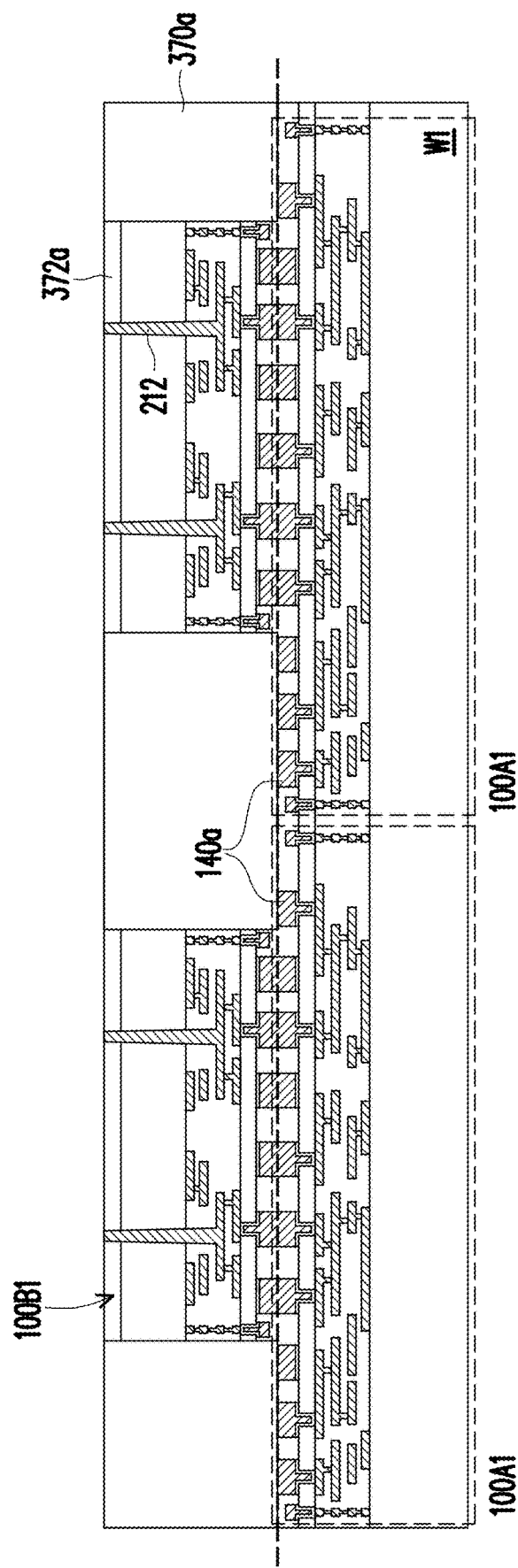

Referring to FIG. 30 and FIG. 31, a dielectric material layer 372 is formed to cover the protruded top ends of the through semiconductor vias 212 of the top tier semiconductor die 100B1, the substrate 210*b*' of the top tier semiconductor die 100B1 and the top surfaces of the insulating encapsulation 370*a*. The dielectric material layer 372 may include dielectric materials such as nitride, and is formed by any deposition process such as a chemical vapor deposition (CVD) process, a physical vapor deposition (PVD) process or other applicable deposition processes. A planarization process is then preformed to remove a portion of the dielectric material layer 372 to form a dielectric layer 372*a*. The planarization process may be a chemical mechanical polishing (CMP) process, a mechanical grinding process, combinations thereof or other applicable planarization processes.

Figure 32:
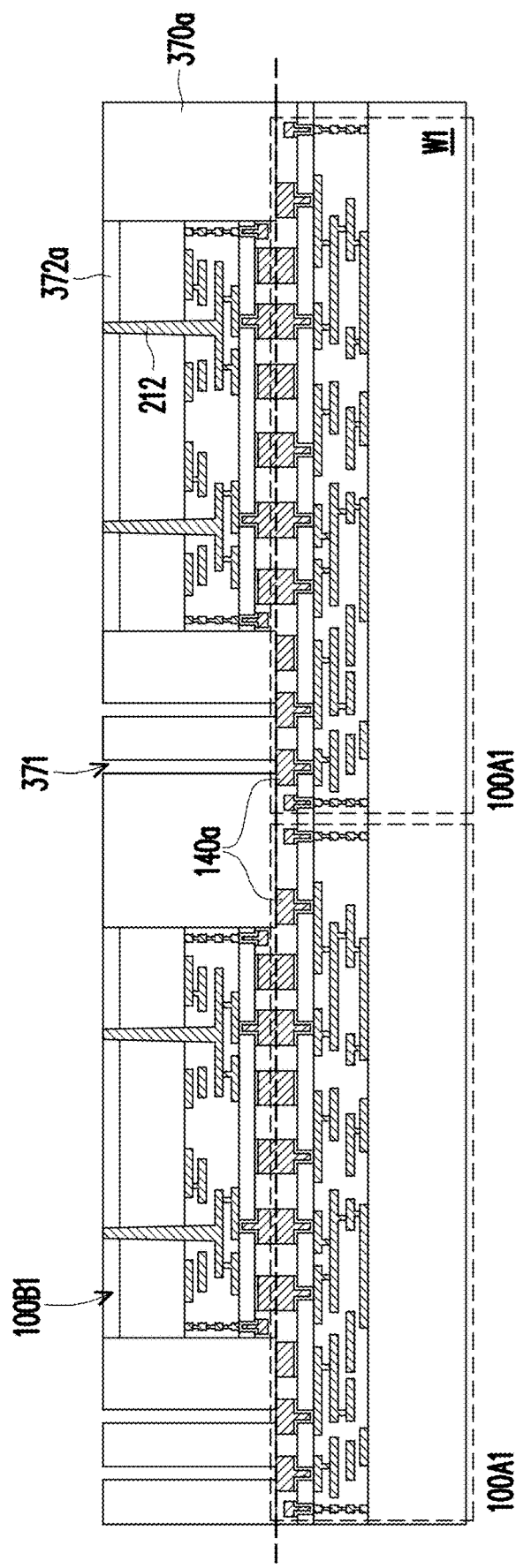
Figure 33:
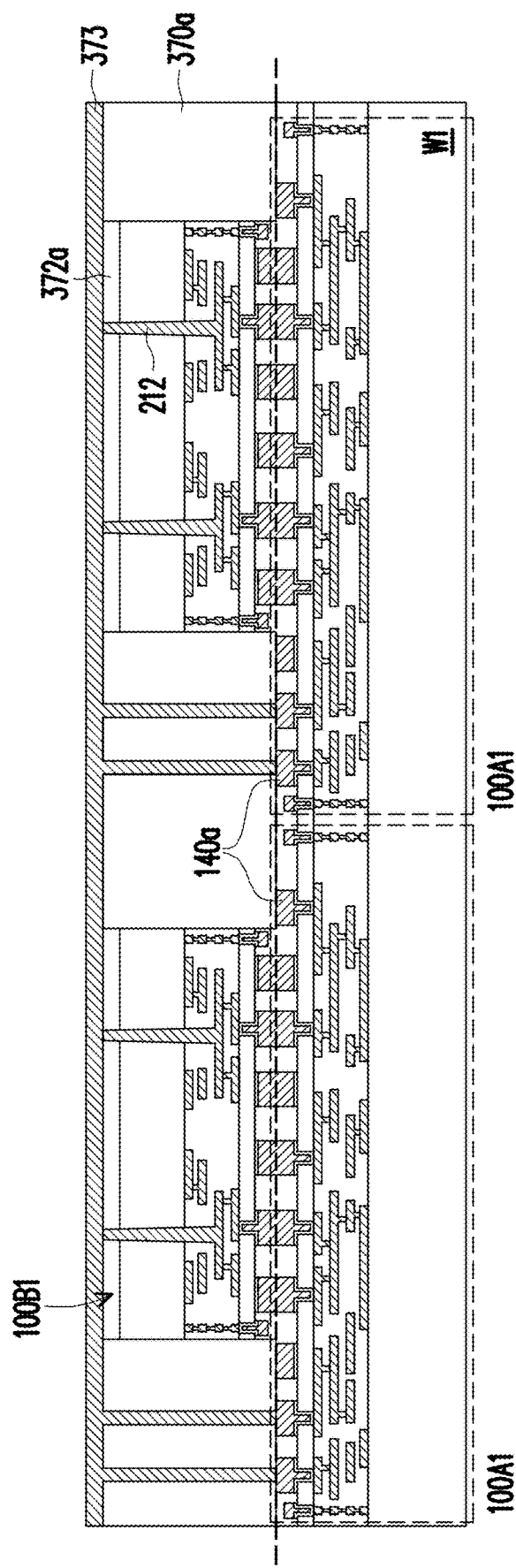
Figure 34:
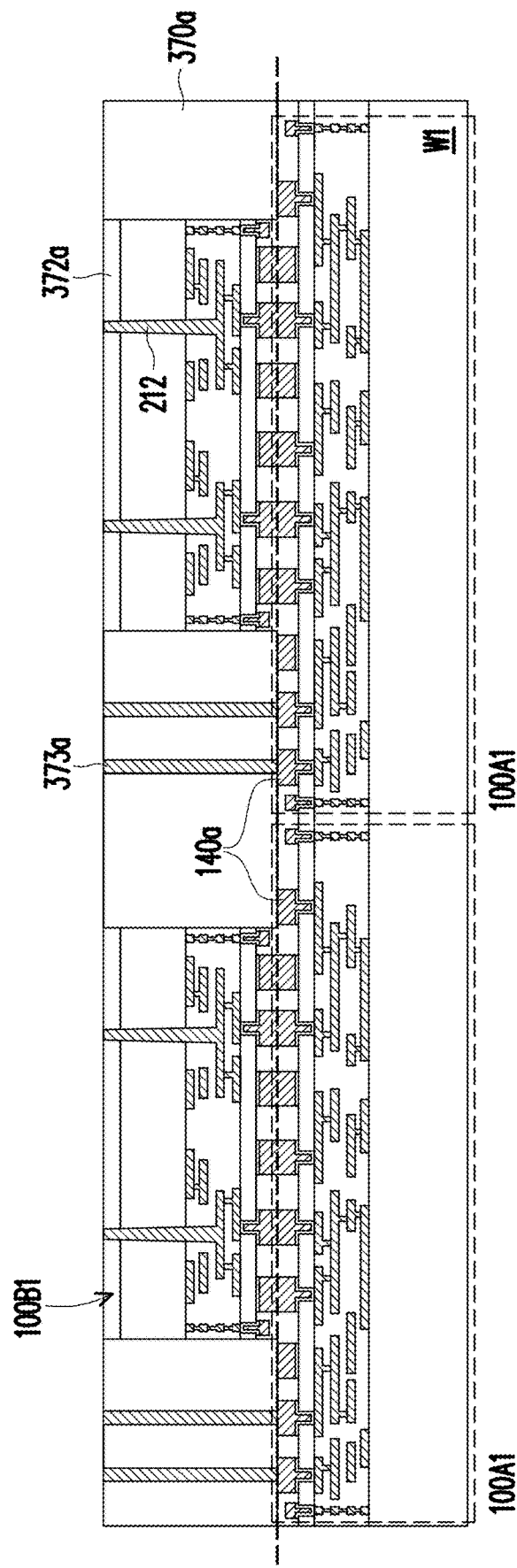

Referring to FIG. 32 to FIG. 34, via openings 371 penetrating through the insulating encapsulation 370*a* are then formed by a suitable process such as a patterning process including lithography followed by etching processes to reveal one or more conductors 140*a* in the bottom tier semiconductor die 100A1. The etching may be performed using the conductors 140*a* as etch stop layers. A conductive material layer 373 is then formed to fill into the via openings 371 and cover the top surface of the insulating encapsulation 370*a*. The conductive material may include a metal or a metal alloy, such as aluminum, copper, nickel, or alloys thereof. A suitable process such as a planarization process, an anisotropic etching process or the like is then performed to remove the excess conductive material. The planarization process may be a chemical mechanical polishing (CMP) process, a mechanical grinding process, combinations thereof or other applicable planarization processes. Conductive vias 373a are thus formed, while the through semiconductor vias 212 of the top tier semiconductor die 100B1 are revealed.

Figure 35:
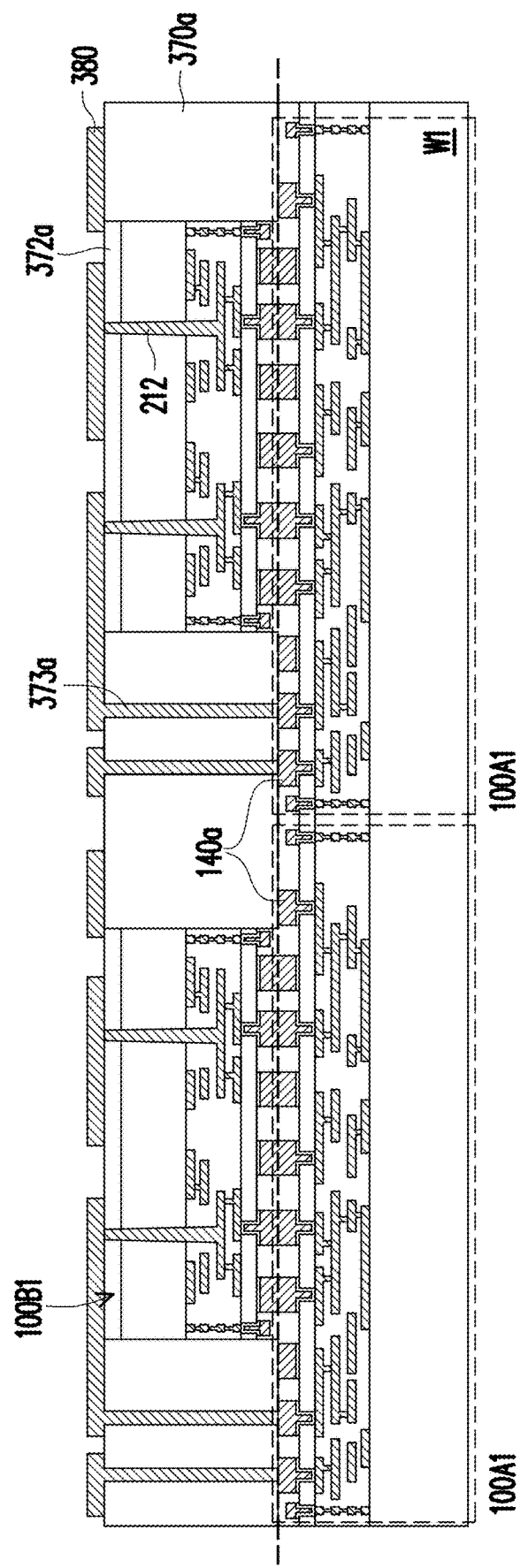
Figure 36:
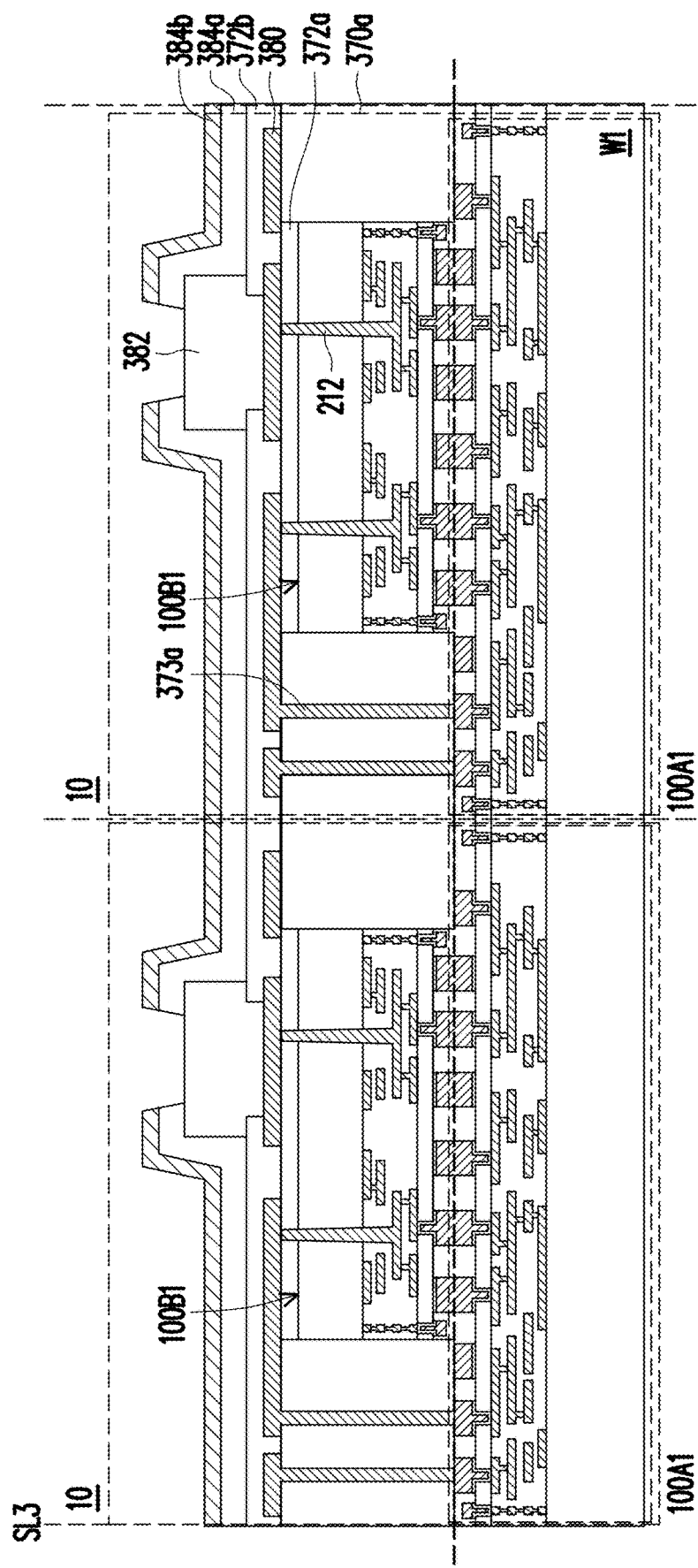

Referring to FIG. 35 and FIG. 36, a redistribution conductive layer 380 is then formed on the insulating encapsulation 370a and the dielectric layer 372a. A portion of the redistribution conductive layer 380 is electrically connected with the through semiconductor vias 212 of the top tier semiconductor die 100B1. Another portion of the redistribution conductive layers 380 is electrically connected with the conductive vias 373a. The redistribution conductive layer 380 may include metal such as copper, nickel, titanium, a combination thereof or the like, and may be formed by an electroplating process. A patterned dielectric layer 372b is then formed to cover the redistribution conductive layer 380 while partially revealing the same. The patterned dielectric layer 372b may include the same material as the dielectric layer 372a, and may be formed by the same process as the formation of the dielectric layer 372a. In some embodiments (not shown), more redistribution conductive layers and dielectric layers may be formed alternatively on the dielectric layer 372b, and the redistribution conductive layers may be electrically connected to each other. Bonding pads 382 are then formed on the revealed portion of the redistribution conductive layer 380, so that the bonding pads 382 are electrically connected with the redistribution conductive layer 380. The material of the bonding pads 382 may include a metal or a metal alloy, such as aluminum, copper, nickel, or alloys thereof. The bonding pads 382 may be formed by providing a patterned photoresist layer on the patterned dielectric layer 372b, plating a bonding pad material layer to fill the openings in the patterned photoresist layer, performing a planarization process, and removing the patterned photoresist layer. Passivation layers 384a and 384b are then formed on the dielectric layer 372b and partially covers the bonding pads 382. The passivation layers 384a and 384b may include silicon oxide, silicon nitride, benzocyclobutene (BCB) polymer, polyimide (PI), polybenzoxazole (PBO) or a combination thereof and is formed by a suitable process such as spin coating, CVD or the like. A wafer sawing process is performed along the scribe lines SL3 of the semiconductor wafer W1 to singulate the semiconductor wafer W1 such that singulated die stack structures 10 are obtained.

Figure 37:
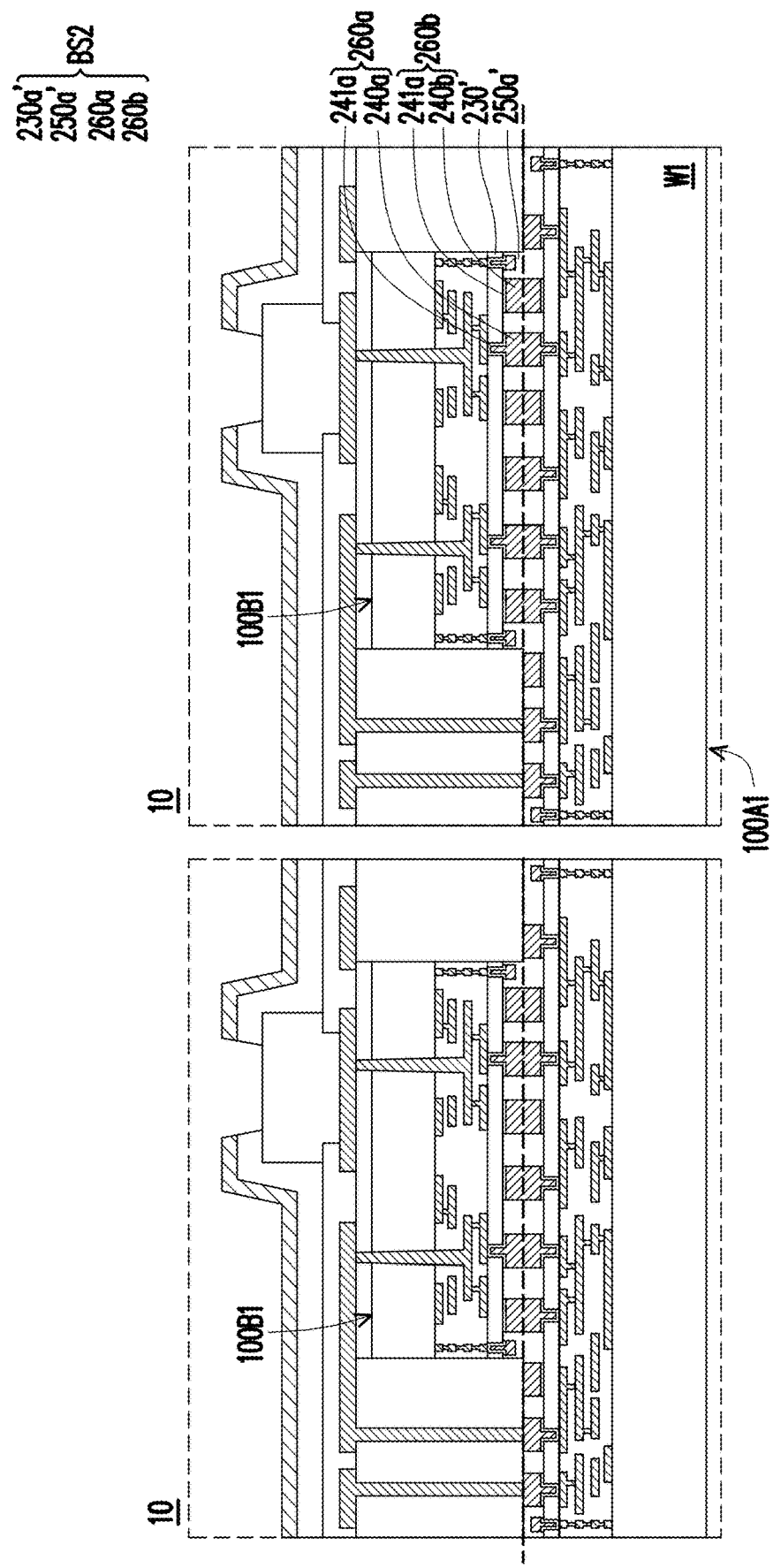

Referring to FIG. 37, the singulated die stack structure 10 includes a top tier semiconductor die 100B 1 including a first bonding structure BS2 and a bottom tier semiconductor die 100A1, the bottom tier semiconductor die 100A1 being bonded to the first bonding structure BS2 of the top tier semiconductor die 100B1. The first bonding structure BS2 may include a first dielectric layer 230', a second dielectric layer 250a' covering the first dielectric layer 230' and first conductors 260a and 260b embedded in the first dielectric layer 230' and the second dielectric layer 250a'. Each of the first conductors 260a includes a conductive barrier layer 241a covering the first dielectric layer 230' and a conductive pillar 240a disposed on the conductive barrier layer 241a, and the conductive pillars 240a are in contact with the second dielectric layer 250a', while each of the first conductors 260b includes a conductive barrier layer 241a covering the first dielectric layer 230' and a conductive pillar 240b disposed on the conductive barrier layer 241a, and the conductive pillars 240b are in contact with the second dielectric layer 250a'.

FIG. 38A through FIG. 38D are cross-sectional views schematically illustrating various semiconductor structure in accordance with some embodiments of the present disclosure.

Figure 38A:
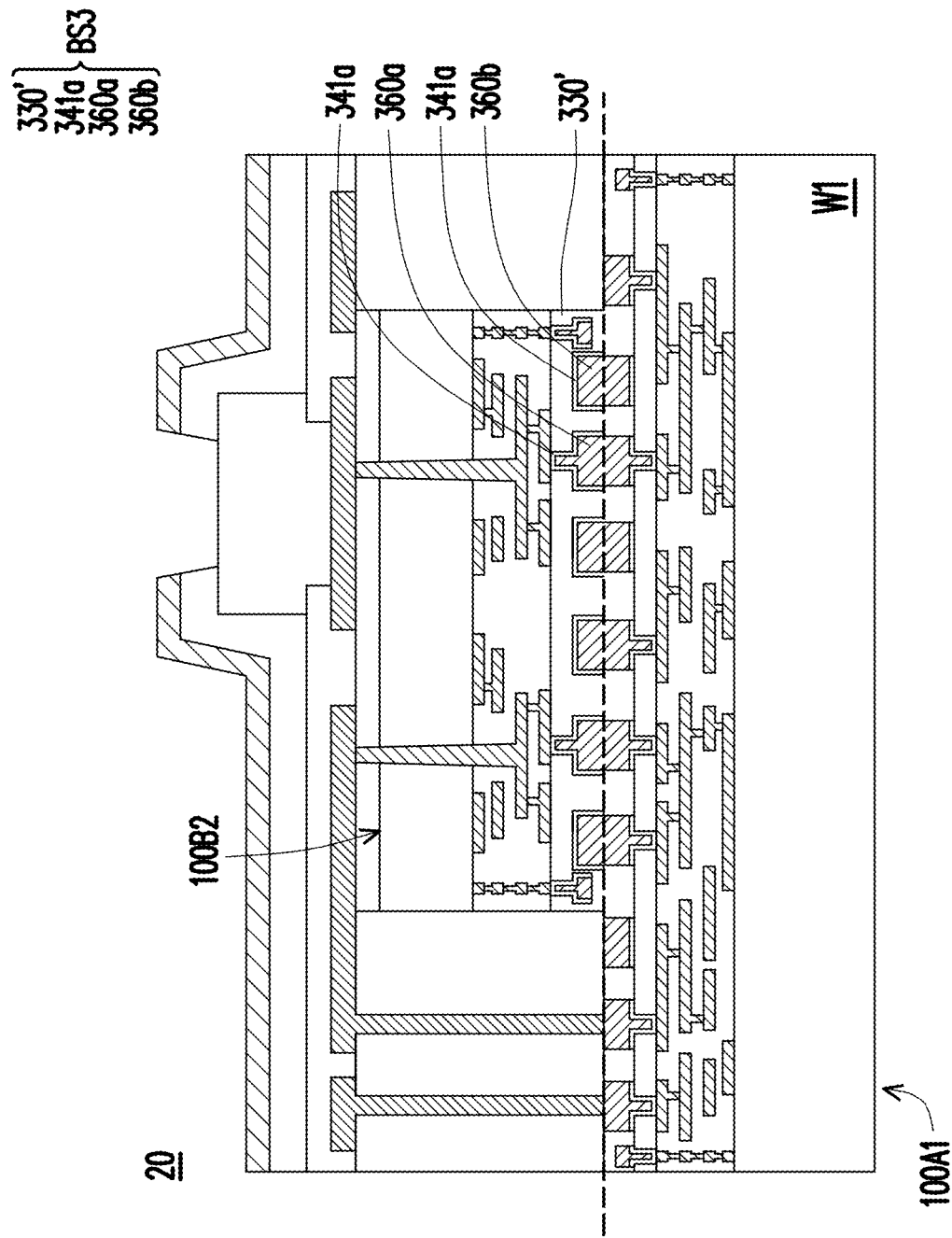
FIG. 38A through FIG. 38D are cross-sectional views schematically illustrating various semiconductor structure in accordance with some embodiments of the present disclosure.

Referring to FIG. 37 and FIG. 38A, the singulated die stack 20 illustrated in FIG. 38A is similar to the singulated die stack 10 illustrated in FIG. 37 except the distribution of the conductive barrier layer 341a. As illustrated in FIG. 38A, the conductive barrier layer 341a covers sidewalls of the conductors 360a and 360b. In other words, the conductors 360a and 360b are spaced apart from the dielectric layer 330' by the conductive barrier layer 341a. The conductors 360a and 360b are not in direct contact with the dielectric layer 330'. In some embodiments, the singulated die stack structure 20 includes a top tier semiconductor die 100B2 including a first bonding structure BS3 and a bottom tier semiconductor die 100A1 which is bonded to the first bonding structure BS3 of the top tier semiconductor die 100B2. In the top tier semiconductor die 100B2 of the singulated die stack structures 20, the first bonding structure BS3 includes a dielectric layer 330', conductors 360a and 360b embedded in the dielectric layer 330' and a conductive barrier layer 341a disposed between the conductors 360a and 360b and the dielectric layer 330. The singulated die stack structure 20 may be formed by a process similar to the process illustrated in FIG. 26 to FIG. 37, except that the first bonding structure BS3 may be formed by a suitable process such as dual damascene process.

Figure 38B:
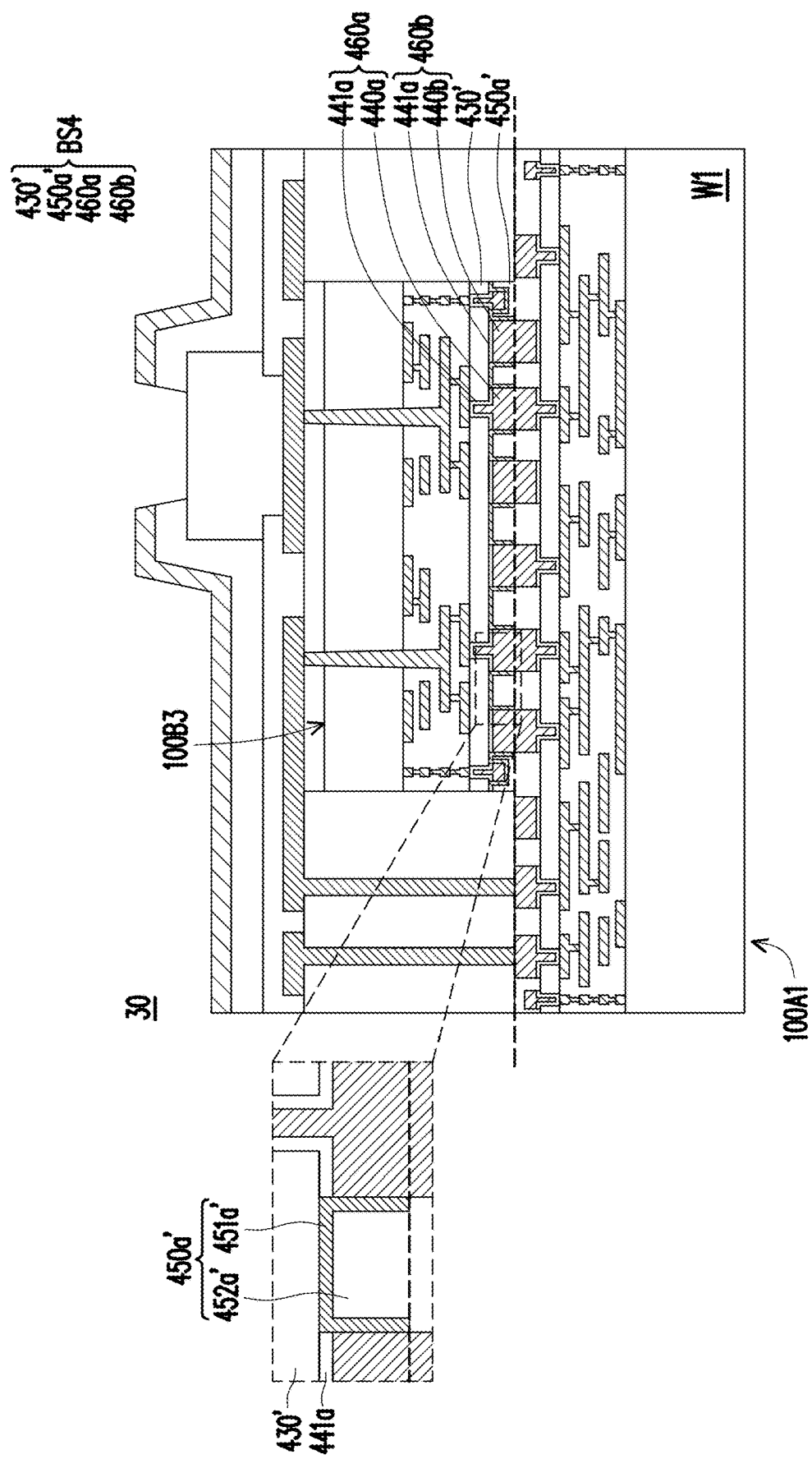

Referring to FIG. 37 and FIG. 38B, the singulated die stack 30 illustrated in FIG. 38B is similar to the singulated die stack 10 illustrated in FIG. 37 except the configuration of the second dielectric layer 450a'. As illustrated in FIG. 38B, the second dielectric layer 450a' includes a barrier portion 451a' and a dielectric portion 452a', and the dielectric portion 452a' is spaced apart from the first dielectric layer 430', the conductive barrier layer 441a and the first conductors 460a and 460b by the barrier portion 451a'. In other words, the dielectric portion 452a' is not in direct contact with the first dielectric layer 430', the conductive barrier layer 441a or the first conductors 460a and 460b, respectively. In some embodiments, the singulated die stack 30 includes a top tier semiconductor die 100B3 including a first bonding structure BS4 and a bottom tier semiconductor die 100A1 which is bonded to the first bonding structure BS4 of the top tier semiconductor die 100B3. In the top tier semiconductor die 100B3 of the singulated die stack structures 30, the first bonding structure BS4 includes a first dielectric layer 430', a second dielectric layer 450a' covering the first dielectric layer 430' and first conductors 460a and 460b embedded in the first dielectric layer 430' and the second dielectric layer 450a'. Each of the first conductors 460a includes a conductive barrier layer 441a covering the first dielectric layer 430' and a conductive pillar 440a disposed on the conductive barrier layer 441a, and the conductive pillars 440a are spaced apart from the dielectric portion 452a' by the barrier portion 451a', while each of the first conductors 460b includes a conductive barrier layer 441a covering the first dielectric layer 430' and a conductive pillar 440b disposed on the conductive barrier layer 441a, and the conductive pillars 440b are spaced apart from the dielectric portion 452a' by the barrier portion 451a'. In addition, the barrier portion 451a' is in contact with the conductive barrier layer 441a. The singulated die stack structure 30 may be formed by a process similar to the process illustrated in FIG. 26 to FIG. 37, except that the top tier semiconductor die 100B3 may be formed by a process similar to the process described in FIG. 17 to FIG. 25.

Figure 38C:
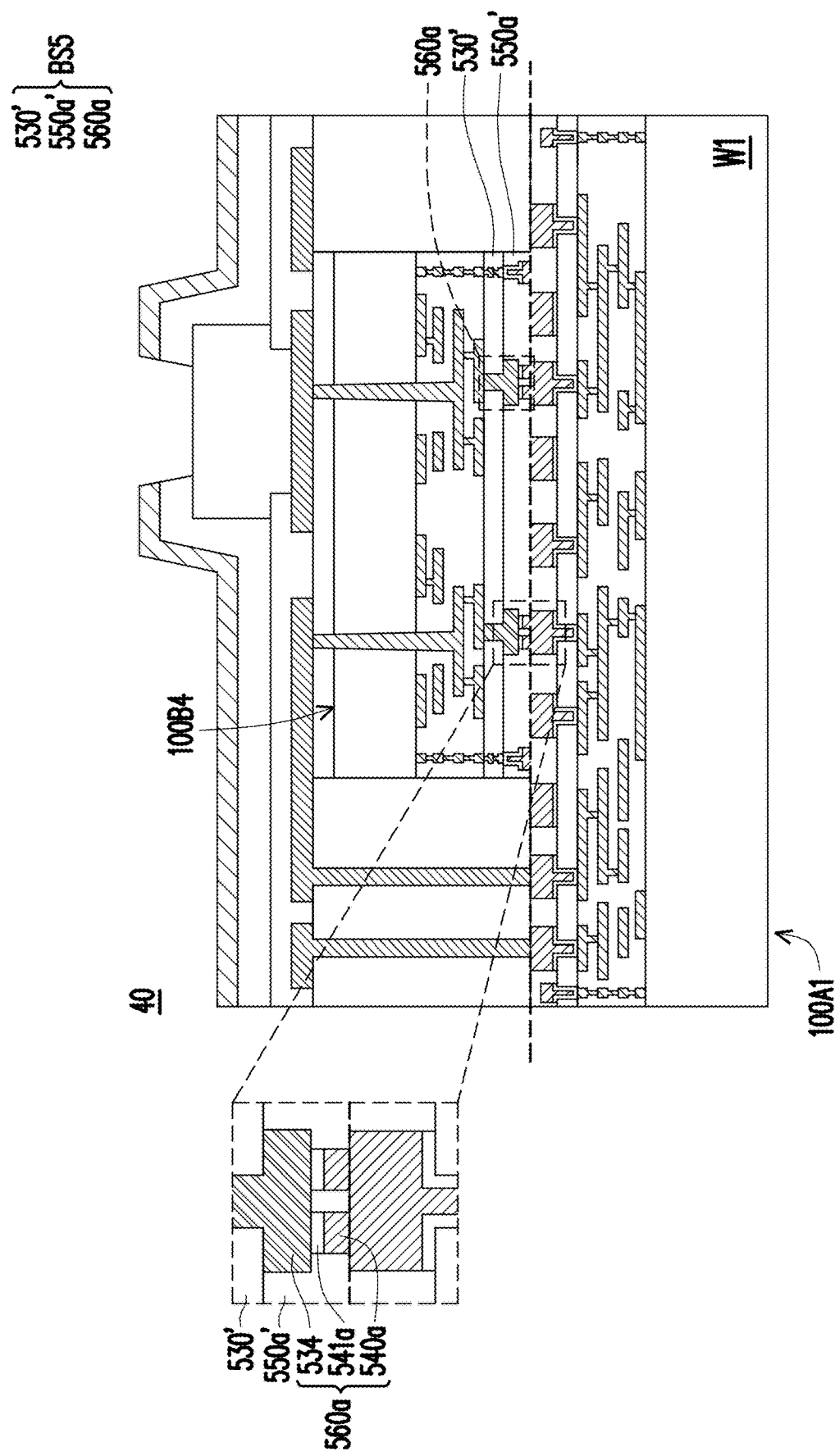

Referring to FIG. 37 and FIG. 38C, the singulated die stack 40 illustrated in FIG. 38C is similar to the singulated die stack 10 illustrated in FIG. 37 except the configuration of the first conductors 560a. As illustrated in FIG. 38C, each of the first conductors 560a includes a first conductive pillar 534, a conductive barrier layer 541a and one or more second conductive pillars 540a. The first conductive pillar 534 is embedded in the first dielectric layer 530' and the second dielectric layer 550a'. The second conductive pillar 540a is disposed on the first conductive pillar 534 and embedded in the second dielectric layer 550a'. The conductive barrier layer 541a is disposed between the first conductive pillar 534 and the second conductive pillar 540a and covering the first conductive pillar 534. In some embodiments, the singulated die stack structure 40 includes a top tier semiconductor die 100B4 including a first bonding structure BS5 and a bottom tier semiconductor die 100A1 being bonded to a first bonding structure BS5 of the top tier semiconductor die 100B4. In the top tier semiconductor die 100B4 of the singulated die stack structures 40, the first bonding structure BS5 includes a first dielectric layer 530', a second dielectric layer 550a' covering the first dielectric layer 530' and first conductors 560a embedded in the first dielectric layer 530' and the second dielectric layer 550a'. Each of the first conductors 560a includes a first conductive pillar 534, a conductive barrier layer 541a covering the first conductive pillar 534 and one or more second conductive pillars 540a disposed on the conductive barrier layer 541a, and the second conductive pillars 540a are in contact with the second dielectric layer 550a'. The singulated die stack structure 40 may be formed by a process similar to the process illustrated in FIG. 26 to FIG. 37, except that the top tier semiconductor die 100B4 may be formed by a process similar to the process described in FIG. 9 to FIG. 16, except that the first conductive pillars 534 are formed prior to the formation of a seed layer by a suitable process. For example, the first conductive pillars 534 may be formed by providing a patterned photoresist layer on the first dielectric layer 530, plating a bonding pad material layer to fill the openings 532 in the first dielectric layer 530 and the openings in the patterned photoresist layer, performing a planarization process and removing the patterned photoresist layer. The material of the first conductive pillars 534 may include a metal or a metal alloy, such as aluminum, copper, nickel, or alloys thereof.

Figure 38D:
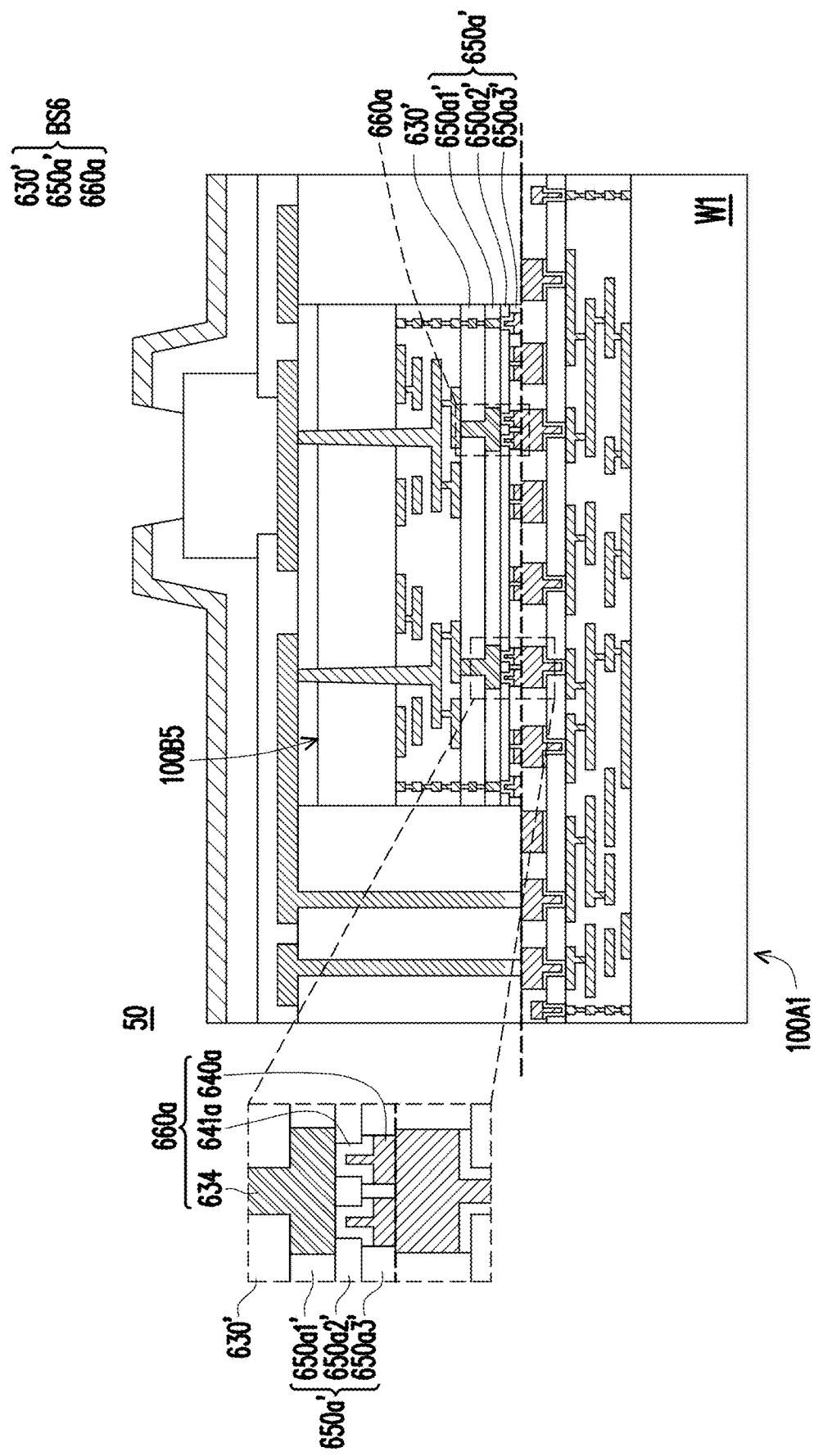

Referring to FIG. 38C and FIG. 38D, the singulated die stack 50 illustrated in FIG. 38D is similar to the singulated die stack 40 illustrated in FIG. 38C except the configuration of the second dielectric layer 650a'. As illustrated in FIG. 38D, The second dielectric layer 650a' includes a first portion 650a1' covering the first dielectric layer 630', a second portion 650a2' covering the first portion 650a1' and a third portion 650a3' covering the second portion 650a2'. In some embodiments, the singulated die stack structure 50 includes a top tier semiconductor die 100B5 including a first bonding structure BS6 and a bottom tier semiconductor die 100A1 being bonded to a first bonding structure BS6 of the top tier semiconductor die 100B5. In the top tier semiconductor die 100B5 of the singulated die stack structures 50, the first bonding structure BS6 includes a first dielectric layer 630', a second dielectric layer 650a' covering the first dielectric layer 630' and first conductors 660a embedded in the first dielectric layer 630' and the second dielectric layer 650a'. The second dielectric layer 650a' includes a first portion 650a1' covering the first dielectric layer 630', a second portion 650a2' covering the first portion 650a1' and a third portion 650a3' covering the second portion 650a2'. Each of the first conductors 660a includes a first conductive pillar 634 embedded in the first dielectric layer 630' and the first portion 650a1' of the second dielectric layer 650a', a conductive barrier layer 641a disposed on the first conductive pillar 634 and covering the second portion 650a2' of the second dielectric layer 650a', and one or more second conductive pillars 640a disposed on the conductive barrier layer 641a and embedded in the second portion 650a2' and the third portion 650a3' of the second dielectric layer 650a'. The second conductive pillars 640a are in contact with the third portion 650a3' of the second dielectric layer 650a'. The singulated die stack structure 50 may be formed by a process similar to the process illustrated in FIG. 26 to FIG. 37, except that the top tier semiconductor die 100B5 may be formed by a process similar to the process described in FIG. 9 to FIG. 16, except that the first conductive pillars 634, the first portion 650a1' of the second dielectric layer and the second portion 650a2' of the second dielectric layer are formed prior to the formation of a seed layer by a suitable process. For example, the first conductive pillars 634 may be formed by providing a patterned photoresist layer on the first dielectric layer 630, plating a bonding pad material layer to fill the openings 632 in the first dielectric layer 630 and the openings in the patterned photoresist layer, performing a planarization process and removing the patterned photoresist layer. The first portion 650a1' of the second dielectric layer may be formed by any deposition process such as a chemical vapor deposition (CVD) process, a physical vapor deposition (PVD) process or other applicable deposition processes followed by a planarization process such as a chemical mechanical polishing (CMP) process, a mechanical grinding process, combinations thereof or other applicable planarization processes. The second portion 650a2' of the second dielectric layer may be formed by any deposition process such as a chemical vapor deposition (CVD) process, a physical vapor deposition (PVD) process or other applicable deposition processes followed by a planarization process such as a chemical mechanical polishing (CMP) process, a mechanical grinding process, combinations thereof or other applicable planarization processes and a patterning process. The material of the first conductive pillars 634 may include a metal or a metal alloy, such as aluminum, copper, nickel, or alloys thereof. The first portion, second portion and the third portion of the second dielectric layer may include a dielectric material such as silicon oxide, silicon nitride, polymer or a combination thereof. The dielectric materials of the first portion and the third portion may be the same or different. In addition, the dielectric material of the second portion may also be the same as or different from the first portion and the third portion.

In accordance with some embodiments of the disclosure, a semiconductor structure including a first semiconductor die and a second semiconductor die is provided. The first semiconductor die includes a first bonding structure. The second semiconductor die is bonded to the first bonding structure of the first semiconductor die. The first bonding structure includes a first dielectric layer, a second dielectric layer covering the first dielectric layer, and first conductors embedded in the first dielectric layer and the second dielectric layer, wherein each of the first conductors includes a first conductive barrier layer covering the first dielectric layer and a first conductive pillar disposed on the first conductive barrier layer, and the first conductive pillars are in contact with the second dielectric layer.

In accordance with some embodiments of the disclosure, a semiconductor die including a semiconductor substrate, an interconnect structure and a bonding structure is provided. The interconnect structure is disposed on the semiconductor substrate and includes conductive wirings. The bonding structure is disposed on the interconnect structure and is electrically connected to the conductive wirings. The bonding structure includes a first dielectric layer, a second dielectric layer covering the first dielectric layer and conductors embedded in the first dielectric layer and the second dielectric layer, wherein each of the conductors includes a conductive barrier layer covering the first dielectric layer and a conductive pillar disposed on the conductive barrier layer, and the conductive pillars are in contact with the second dielectric layer.

In accordance with some embodiments of the disclosure, a semiconductor die including a semiconductor substrate, an interconnect structure and a bonding structure is provided. The interconnect structure is disposed on the semiconductor substrate and includes conductive wirings. The bonding structure is disposed on the interconnect structure and is electrically connected to the conductive wirings. The bonding structure includes a first dielectric layer, a second dielectric layer covering the first dielectric layer, bonding features embedded in the first dielectric layer and the second dielectric layer, and conductors embedded in the second dielectric layer and disposed on the bonding features, wherein each of the conductors includes a conductive barrier layer covering at least a portion of the bonding features and a conductive pillar disposed on the conductive barrier layer, and the conductive pillars are in contact with the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first semiconductor die comprising a first bonding structure, wherein the first bonding structure comprises:
a first dielectric layer;
a second dielectric layer covering the first dielectric layer, wherein the second dielectric layer comprises a barrier portion and a dielectric portion, and the dielectric portion is spaced apart from the first dielectric layer by the barrier portion;
first conductors penetrating through the first dielectric layer and the second dielectric layer, wherein the barrier portion extends between the dielectric portion and sidewalls of the first conductors, and the barrier portion extends between the dielectric portion and the first dielectric layer.

2. The semiconductor structure as claimed in claim 1, wherein the barrier portion is a dielectric barrier portion, and the first conductors are spaced apart from the dielectric portion by the dielectric barrier portion.

3. The semiconductor structure as claimed in claim 1, wherein the barrier portion covers the sidewalls of the first conductors.

4. The semiconductor structure as claimed in claim 1, wherein the first conductors each comprises a first conductive barrier layer covering the first dielectric layer and a first conductive pillar disposed on the first conductive barrier layer.

5. The semiconductor structure as claimed in claim 4, wherein the barrier portion covers sidewalls of the first conductive barrier layers and sidewalls of the first conductive pillars.

6. The semiconductor structure as claimed in claim 4, wherein the first conductive pillar is spaced apart from the first dielectric layer by the first conductive barrier layer.

7. The semiconductor structure as claimed in claim 1 further comprising second conductors disposed on the first dielectric layer, wherein the second conductors penetrate through the second dielectric layer.

8. The semiconductor structure as claimed in claim 7, wherein the second conductors each comprises a second conductive barrier layer covering the first dielectric layer and a second conductive pillar disposed on the second conductive barrier layer.

9. The semiconductor structure as claimed in claim 8, wherein the barrier portion covers sidewalls of the second conductive barrier layers and sidewalls of the second conductive pillars.

10. The semiconductor structure as claimed in claim 8, wherein the second conductive pillar is spaced apart from the first dielectric layer by the second conductive barrier layer.

11. The semiconductor structure as claimed in claim 8, wherein the second conductive pillar and the second conductive barrier layer are spaced apart from the dielectric portion by the barrier portion.

12. The semiconductor structure as claimed in claim 1 further comprising:
a second semiconductor die comprising a second bonding structure bonded to the first bonding structure, wherein the first bonding structure comprises:
a third dielectric layer;
a fourth dielectric layer covering the third dielectric layer; and
third conductors penetrating through the third dielectric layer and the fourth dielectric layer.

13. A semiconductor structure, comprising:
a first semiconductor die comprising a first bonding structure, wherein the first bonding structure comprises:
a first dielectric layer;
first conductors penetrating through and protruding from the first dielectric layer;
a second dielectric layer disposed on the first dielectric layer and laterally encapsulate protruding portions of the first conductors, wherein the second dielectric layer comprises a barrier portion and a dielectric portion, the barrier portion is in contact with the protruding portions of the first conductors, and the barrier portion is between the dielectric portion and the protruding portions of the first conductors, wherein the barrier portion extends between the dielectric portion and sidewalls of the first conductors, and the barrier portion extends between the dielectric portion and the first dielectric layer, and wherein the barrier portion is in direct contact with the dielectric portion, the sidewalls of the first conductors and the first dielectric layer;

a second semiconductor die comprising a second bonding structure, the second bonding structure being bonded to the first bonding structure; and an encapsulation laterally encapsulating the first semiconductor die.

14. The semiconductor structure as claimed in claim 13, wherein a first lateral dimension of the first bonding structure is smaller than a second lateral dimension of the second bonding structure.

15. The semiconductor structure as claimed in claim 13, wherein sidewalls of the second semiconductor die substantially align with sidewalls of the encapsulant.

16. The semiconductor structure as claimed in claim 13, wherein the first semiconductor die further comprises through semiconductor vias electrically connected to the first bonding structure.

17. The semiconductor structure as claimed in claim 16 further comprising a redistribution conductive layer, wherein the redistribution conductive layer is electrically connected to the through semiconductor vias.

18. A semiconductor structure, comprising:
a first semiconductor die comprising a first bonding structure, wherein the first bonding structure comprises:
a first dielectric layer;
a second dielectric layer covering the first dielectric layer, wherein the second dielectric layer comprises a barrier portion and a dielectric portion, and the dielectric portion is spaced apart from the first dielectric layer by the barrier portion;
first conductors penetrating through the first dielectric layer and the second dielectric layer; and
seal ring elements penetrating through the first dielectric layer and covered by the second dielectric layer, wherein the first conductors are thicker than the seal ring elements, wherein the barrier portion extends between the dielectric portion and the seal ring elements, and the seal ring elements are spaced apart from the dielectric portion by the barrier portion.

19. The semiconductor structure as claimed in claim 18, wherein top surfaces of the first conductors substantially level with a top surface of the second dielectric layer.

20. The semiconductor structure as claimed in claim 19, wherein a first level height wherein top surfaces of the seal ring elements are located is between the top surface of the second dielectric layer and a top surface of the first dielectric layer.

* * * * *